United States Patent
Bakshi et al.

(10) Patent No.: US 12,489,211 B2
(45) Date of Patent: Dec. 2, 2025

(54) ELECTRONIC DEVICE WITH PATCH ANTENNA IN PACKAGING SUBSTRATE

(71) Applicant: Texas Instruments Incorporated, Dallas, TX (US)

(72) Inventors: Harshpreet Singh Phull Bakshi, Dallas, TX (US); Rajen Manicon Murugan, Dallas, TX (US); Sylvester Ankamah-Kusi, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 127 days.

(21) Appl. No.: 18/429,140

(22) Filed: Jan. 31, 2024

(65) Prior Publication Data

US 2024/0313404 A1    Sep. 19, 2024

Related U.S. Application Data

(60) Provisional application No. 63/490,382, filed on Mar. 15, 2023.

(51) Int. Cl.
*H01Q 9/04*    (2006.01)
*H01Q 1/22*    (2006.01)
(Continued)

(52) U.S. Cl.
CPC ......... *H01Q 9/0407* (2013.01); *H01Q 1/2283* (2013.01); *H01Q 1/38* (2013.01); *H01Q 1/422* (2013.01)

(58) Field of Classification Search
CPC ...... H01Q 9/0407; H01Q 1/2283; H01Q 1/38; H01Q 1/422; H01Q 1/48; H01Q 1/526
See application file for complete search history.

(56) References Cited

U.S. PATENT DOCUMENTS

| 3,388,339 A | 6/1968 | Malnar et al. |
| 8,217,724 B2 | 7/2012 | Briggs et al. |

(Continued)

OTHER PUBLICATIONS

Y. Zhang and J. Mao, "An Overview of the Development of Antenna-in-Package Technology for Highly Integrated Wireless Devices," in Proceedings of the IEEE, vol. 107, No. 11, pp. 2265-2280, Nov. 2019, doi: 10.1109/JPROC.2019.2933267.

(Continued)

*Primary Examiner* — Seung H Lee
(74) *Attorney, Agent, or Firm* — Ronald O. Neerings; Frank D. Cimino

(57) ABSTRACT

An electronic device includes a multilevel package substrate, a semiconductor die, and a package structure, the multilevel package substrate has first, second, and third levels including respective dielectric layers and conductive features, the first level including a first trace layer with an antenna and a first via layer with a portion of a ground wall laterally spaced outward from and surrounding the antenna, and the second level including a second trace layer having a ground plane connected to the ground wall, the semiconductor die attached to the first level of the multilevel package substrate, and the package structure including a molding compound enclosing the semiconductor die and extending on a side of the antenna, where the package structure mold compound maters and thickness can be tuned for improved performance.

20 Claims, 25 Drawing Sheets

(51) Int. Cl.
*H01Q 1/38* (2006.01)
*H01Q 1/42* (2006.01)

(56) References Cited

U.S. PATENT DOCUMENTS

| | | | |
|---|---|---|---|
| 8,624,682 B2 | 1/2014 | Ridley et al. | |
| 8,680,854 B2 | 3/2014 | Dyer et al. | |
| 8,836,327 B2 | 9/2014 | French et al. | |
| 8,906,470 B2 | 12/2014 | Overstolz et al. | |
| 9,201,404 B2 | 12/2015 | Harasaka et al. | |
| 9,529,334 B2 | 12/2016 | Herbsommer et al. | |
| 11,532,875 B2 * | 12/2022 | Chiang | H01Q 1/422 |
| 2005/0007118 A1 | 1/2005 | Kitching et al. | |
| 2005/0271250 A1 | 12/2005 | Vallone et al. | |
| 2006/0022761 A1 | 2/2006 | Abeles et al. | |
| 2007/0164907 A1 | 7/2007 | Gaucher | |
| 2007/0247241 A1 | 10/2007 | Bruan et al. | |
| 2010/0156547 A1 | 6/2010 | McGuyer et al. | |
| 2010/0189605 A1 | 7/2010 | Schmid et al. | |
| 2011/0128082 A1 | 6/2011 | Maki et al. | |
| 2011/0147367 A1 | 6/2011 | Borwick, III et al. | |
| 2011/0181488 A1 | 7/2011 | Tang | |
| 2013/0015850 A1 | 1/2013 | Lindorfer et al. | |
| 2013/0017653 A1 | 1/2013 | Lachner | |
| 2013/0021208 A1 | 1/2013 | Seok et al. | |
| 2013/0026586 A1 | 1/2013 | Seok et al. | |
| 2013/0044921 A1 | 2/2013 | In et al. | |
| 2013/0059551 A1 | 3/2013 | Ginsburg et al. | |
| 2013/0147472 A1 | 6/2013 | French et al. | |
| 2013/0176703 A1 | 7/2013 | Hopper et al. | |
| 2013/0299967 A1 | 11/2013 | Daniels et al. | |
| 2014/0285289 A1 | 9/2014 | Herbsommer et al. | |
| 2014/0287701 A1 | 9/2014 | Herbsommer et al. | |
| 2014/0287703 A1 | 9/2014 | Herbsommer et al. | |
| 2014/0347074 A1 | 11/2014 | Nadeau | |
| 2014/0368377 A1 | 12/2014 | Nadeau et al. | |
| 2014/0373599 A1 | 12/2014 | Trombley et al. | |
| 2015/0001694 A1 | 1/2015 | Hopper et al. | |
| 2015/0027908 A1 | 1/2015 | Parsa et al. | |
| 2015/0028866 A1 | 1/2015 | Parsa et al. | |
| 2015/0084707 A1 | 3/2015 | Maki | |
| 2015/0244382 A1 | 8/2015 | Ishihara | |
| 2015/0277386 A1 | 10/2015 | Passilly et al. | |
| 2015/0280320 A1 | 10/2015 | Haroun et al. | |
| 2015/0295305 A1 | 10/2015 | Herbsommer et al. | |
| 2016/0276731 A1 | 9/2016 | Seok et al. | |
| 2017/0093010 A1 | 3/2017 | Herbsommer et al. | |
| 2018/0156875 A1 | 6/2018 | Herbsommer et al. | |
| 2019/0013288 A1 | 1/2019 | Kim et al. | |
| 2019/0103680 A1 | 4/2019 | Liao | |
| 2019/0152773 A1 | 5/2019 | Herbsommer et al. | |
| 2019/0334220 A1 | 10/2019 | Ali et al. | |
| 2019/0346814 A1 | 11/2019 | Fruehling et al. | |
| 2020/0118949 A1 | 4/2020 | Moallem et al. | |
| 2020/0194871 A1 | 6/2020 | Moallem et al. | |
| 2020/0212536 A1 | 7/2020 | Gupta et al. | |
| 2020/0241480 A1 | 7/2020 | Bahr et al. | |
| 2020/0259239 A1 | 8/2020 | Moallem et al. | |
| 2020/0259240 A1 | 8/2020 | Moallem | |
| 2020/0403299 A1 | 12/2020 | Gupta et al. | |
| 2021/0050652 A1 | 2/2021 | Moallem et al. | |
| 2022/0028593 A1 * | 1/2022 | Tang | H01L 23/49503 |
| 2022/0359976 A1 | 11/2022 | Tang | |
| 2022/0376378 A1 | 11/2022 | Tang | |
| 2023/0044284 A1 | 2/2023 | Murugan | |
| 2023/0055211 A1 * | 2/2023 | Ankamah-Kusi | H05K 1/0263 |

OTHER PUBLICATIONS

F. Ahmed, M. Furqan and A. Stelzer, "120-GHz and 240-GHz Broadband Bow-Tie Antennas in eWLB Package for High Resolution Radar Applications," 2018 48th European Microwave Conference (EuMC), 2018, pp. 1109-1112, doi: 10.23919/EuMC.2018.8541732.

S. Beer and T. Zwick, "122 GHz antenna-integration in a plastic package based on a flip chip interconnect," 2011 IEEE MTT-S International Microwave Workshop Series on Millimeter Wave Integration Technologies, 2011, pp. 37-40, doi: 10.1109/IMWS3.2011.6061881.

C. Wang et al., "InFO_AiP Technology for High Performance and Compact 5G Millimeter Wave System Integration," 2018 IEEE 68th Electronic Components and Technology Conference (ECTC), 2018, pp. 202-207, doi: 10.1109/ECTC.2018.00039.

A. O. Watanabe et al., "3D Glass-Based Panel-Level Package with Antenna and Low-Loss Interconnects for Millimeter-Wave 5G Applications," 2019 IEEE MTT-S International Microwave Conference on Hardware and Systems for 5G and Beyond (IMC-5G), 2019, pp. 1-3, doi: 10.1109/IMC-5G47857.2019.9160350.

H. S. Bakshi et al., "Low-Cost Packaging of 300 GHz Integrated Circuits With an On-Chip Patch Antenna," in IEEE Antennas and Wireless Propagation Letters, vol. 18, No. 11, pp. 2444-2448, Nov. 2019, doi: 10.1109/LAWP.2019.2943371.

H. S. Bakshi, R. Murugan and S. Ankamah-Kusi, "Improvement of Radiation Characteristics of a 300-GHz On-Chip Patch Antenna with Epoxy Mold Compound (EMC) Encapsulation," 2022 IEEE 31st Conference on Electrical Performance of Electronic Packaging and Systems (EPEPS), San Jose, CA, USA, 2022, pp. 1-3, doi: 10.1109/EPEPS53828.2022.9947128.

International Search Report and Written Opinion dated Jun. 3, 2024, PCT Application No. PCT/US2024/018681, 12 pages.

* cited by examiner

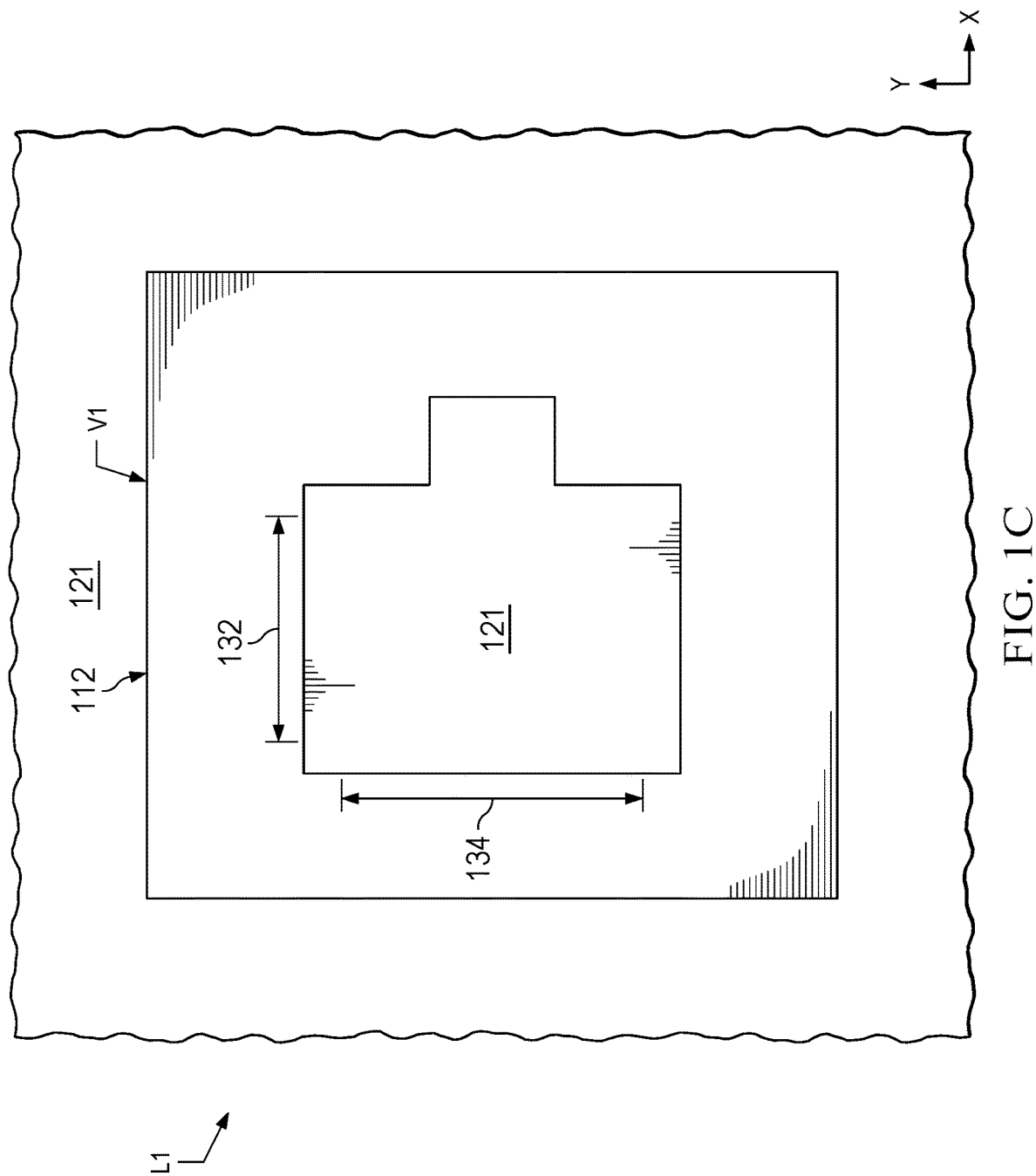

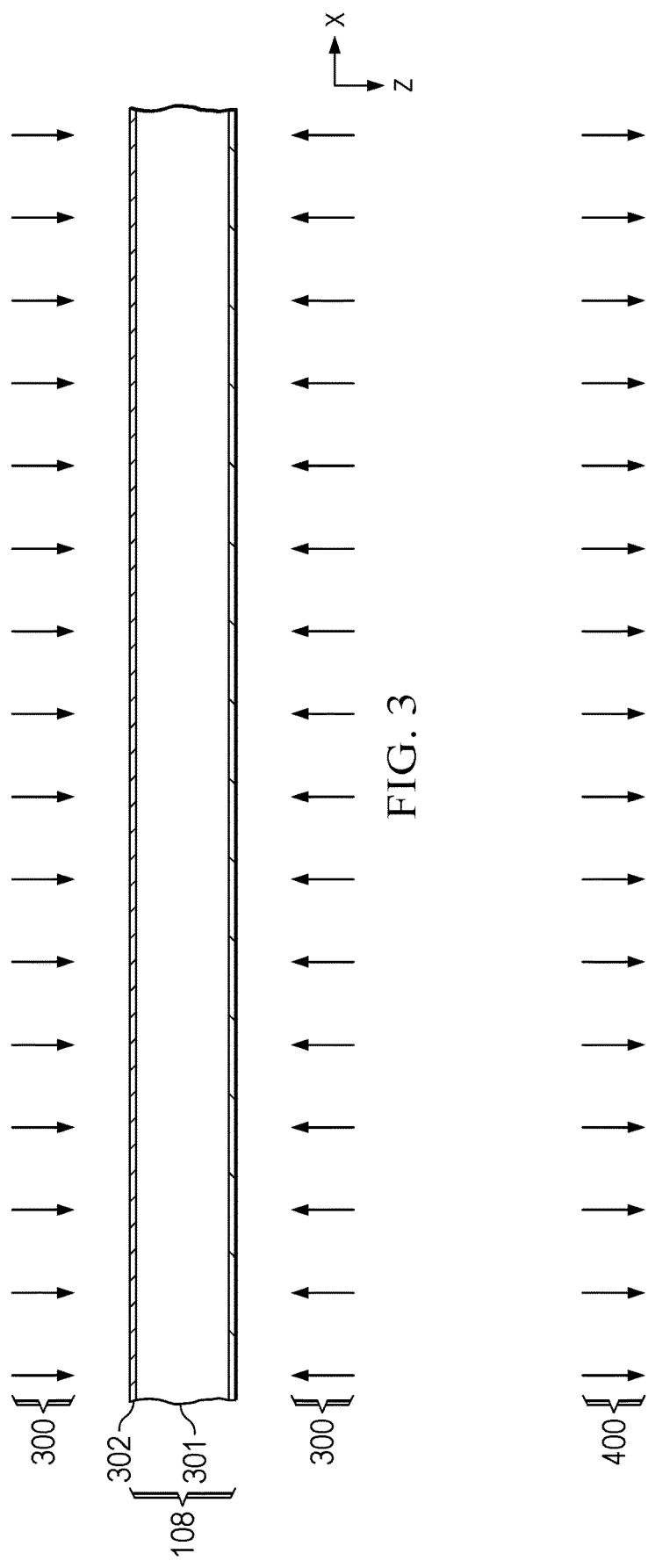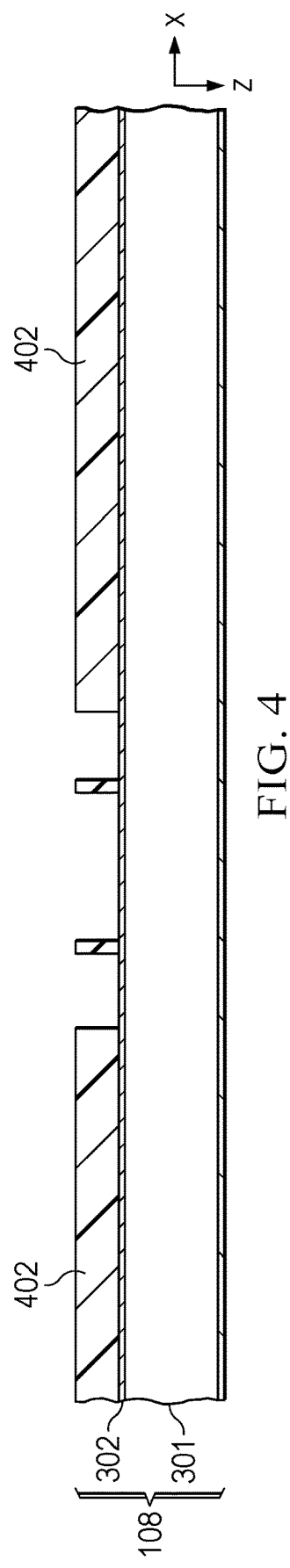

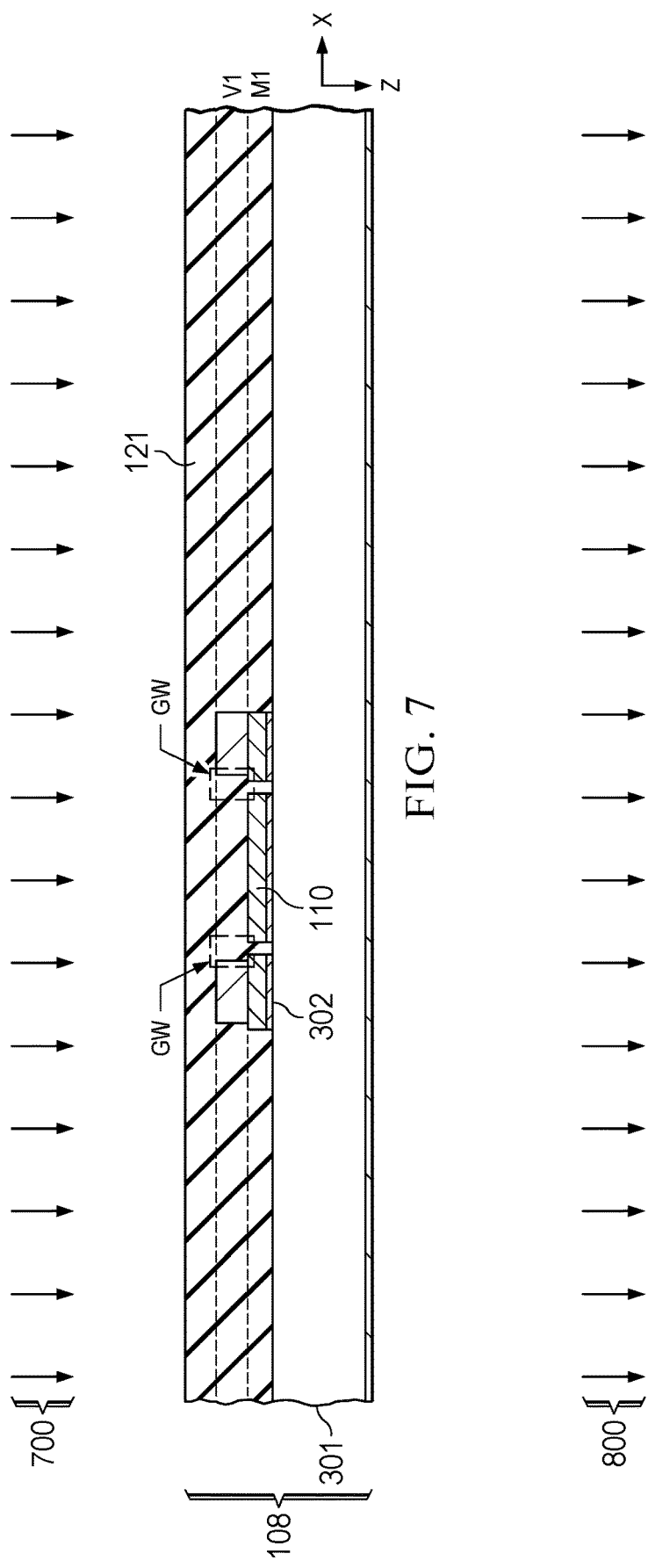

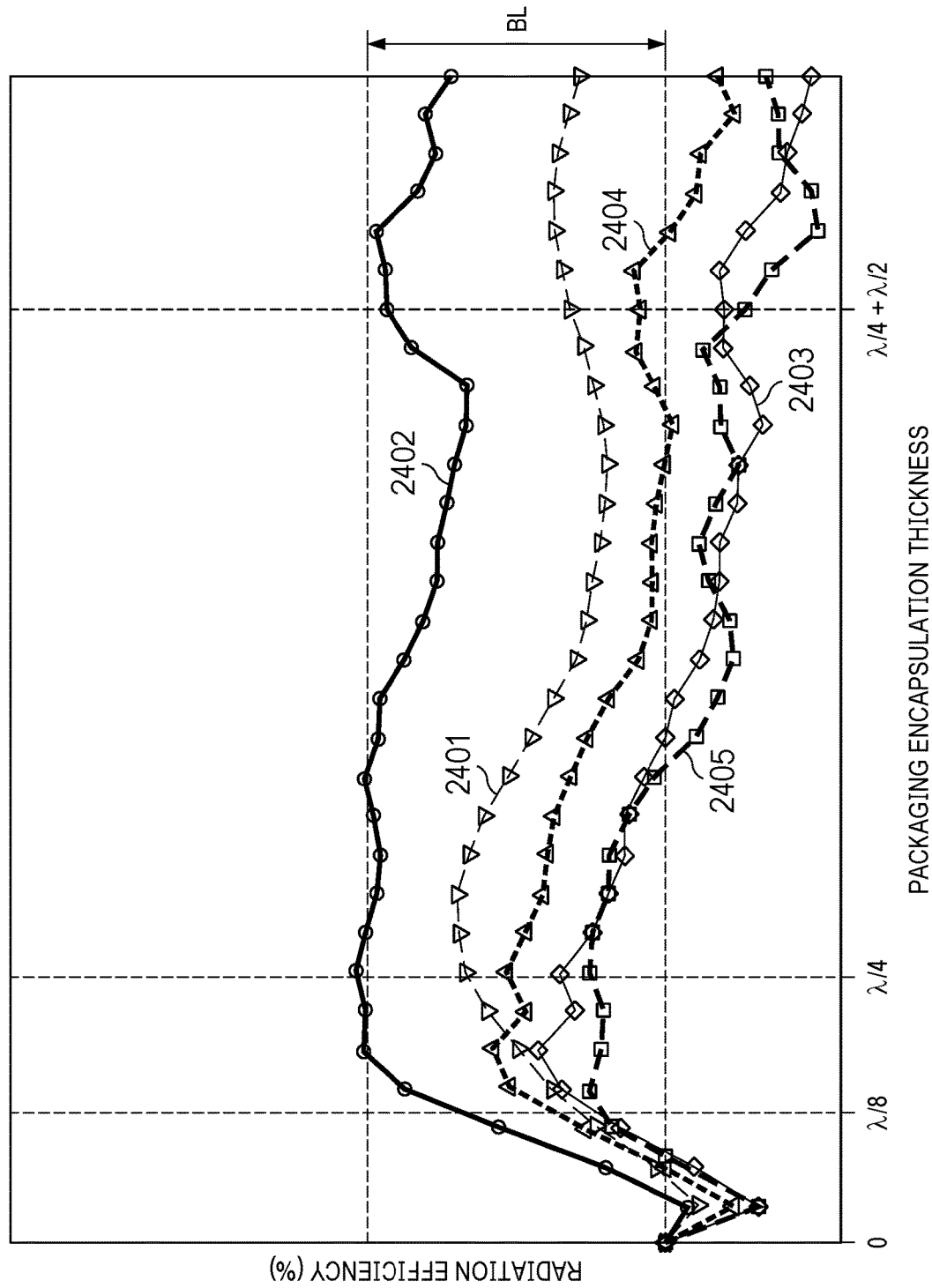

ELECTRONIC DEVICE WITH PATCH ANTENNA IN PACKAGING SUBSTRATE

CROSS-REFERENCE TO RELATED APPLICATION

This application claims priority to and benefit of U.S. Provisional Patent Application No. 63/490,382, filed on Mar. 15, 2023, and titled "300-GHz Rectangular Patch Antenna on Multi-Layer Substrate Package with EMC Overmold", the contents of which are hereby fully incorporated by reference.

BACKGROUND

Antennas can be integrated into electronic devices or systems to implement wireless communication functionality for mm wavelength, THz frequency and other applications. Integrated antennas can be implemented on-chip, within semiconductor packages and on a host system printed circuit board (PCB). However, on-chip antennas operating in the mm wavelength and THz frequency bands can suffer from poor radiation efficiency due to ohmic losses (e.g., $I^2R$ losses) from metal layers of the semiconductor die or chip as well as from high dielectric loss tangents of the package molding compound at these frequencies. Antennas on package can also suffer from performance degradation due to dielectric losses of the packaging materials, and there is loss of radiated power to generated higher-order surface wave modes, which further limits the antenna radiation efficiency of planar structures. In addition, proximity to off-chip components can cause reflection and absorption of electromagnetic energy which can degrade the directionality and overall radiation performance of these antennas.

SUMMARY

In one aspect, an electronic device includes a multilevel package substrate, a semiconductor die attached to a first level of the multilevel package substrate, and a package structure. The multilevel package substrate has the first level, a second level, and a third level, the first, second, and third levels each including a respective dielectric layer and patterned conductive features, the first, second, and third levels extending in respective first, second, and third planes of a first direction and an orthogonal second direction, the second level between the first and third levels along a third direction that is orthogonal to the first and second directions, the first level including a first trace layer with an antenna and a first via layer with a portion of a ground wall laterally spaced outward from and surrounding the antenna, and the second level including a second trace layer having a ground plane connected to the ground wall. The package structure includes a molding compound that encloses the semiconductor die and extends on a side of the antenna.

In another aspect, a system includes a circuit board and an electronic device. The electronic device includes a multilevel package substrate, a semiconductor die attached to a first level of the multilevel package substrate, and a package structure. The multilevel package substrate has the first level, a second level, and a third level, the first, second, and third levels each including a respective dielectric layer and patterned conductive features, the first, second, and third levels extending in respective first, second, and third planes of a first direction and an orthogonal second direction, the second level between the first and third levels along a third direction that is orthogonal to the first and second directions, the first level including a first trace layer with an antenna and a first via layer with a portion of a ground wall laterally spaced outward from and surrounding the antenna, and the second level including a second trace layer having a ground plane connected to the ground wall. The package structure includes a molding compound that encloses the semiconductor die and extends on a side of the antenna.

In a further aspect, a method of fabricating an electronic device includes fabricating a multilevel package substrate, including forming a first level, a second level, and a third level, the first, second, and third levels each including a respective dielectric layer and respective patterned conductive features, the second level between the first and third levels, the first level including a first trace layer with an antenna and a first via layer with a portion of a ground wall laterally spaced outward from and surrounding the antenna, and the second level including a second trace layer having a ground plane connected to the ground wall. The method further includes flip-chip attaching a semiconductor die to the first level of the multilevel package substrate, and forming a package structure including a molding compound that encloses the die and extends on a side of the antenna.

BRIEF DESCRIPTION OF THE DRAWINGS

FIG. 1C is a partial sectional top view of a first via layer in the multilevel package substrate of the electronic device of FIGS. 1-1B.

FIGS. 3-22 are partial side elevation views of the electronic device of FIG. 1 undergoing fabrication processing according to the method of FIG. 2.

FIG. 24 is a graph with curves showing simulated radiation efficiency as a function of epoxy molding compound encapsulation thickness for various encapsulation materials.

DETAILED DESCRIPTION

Figure 1:
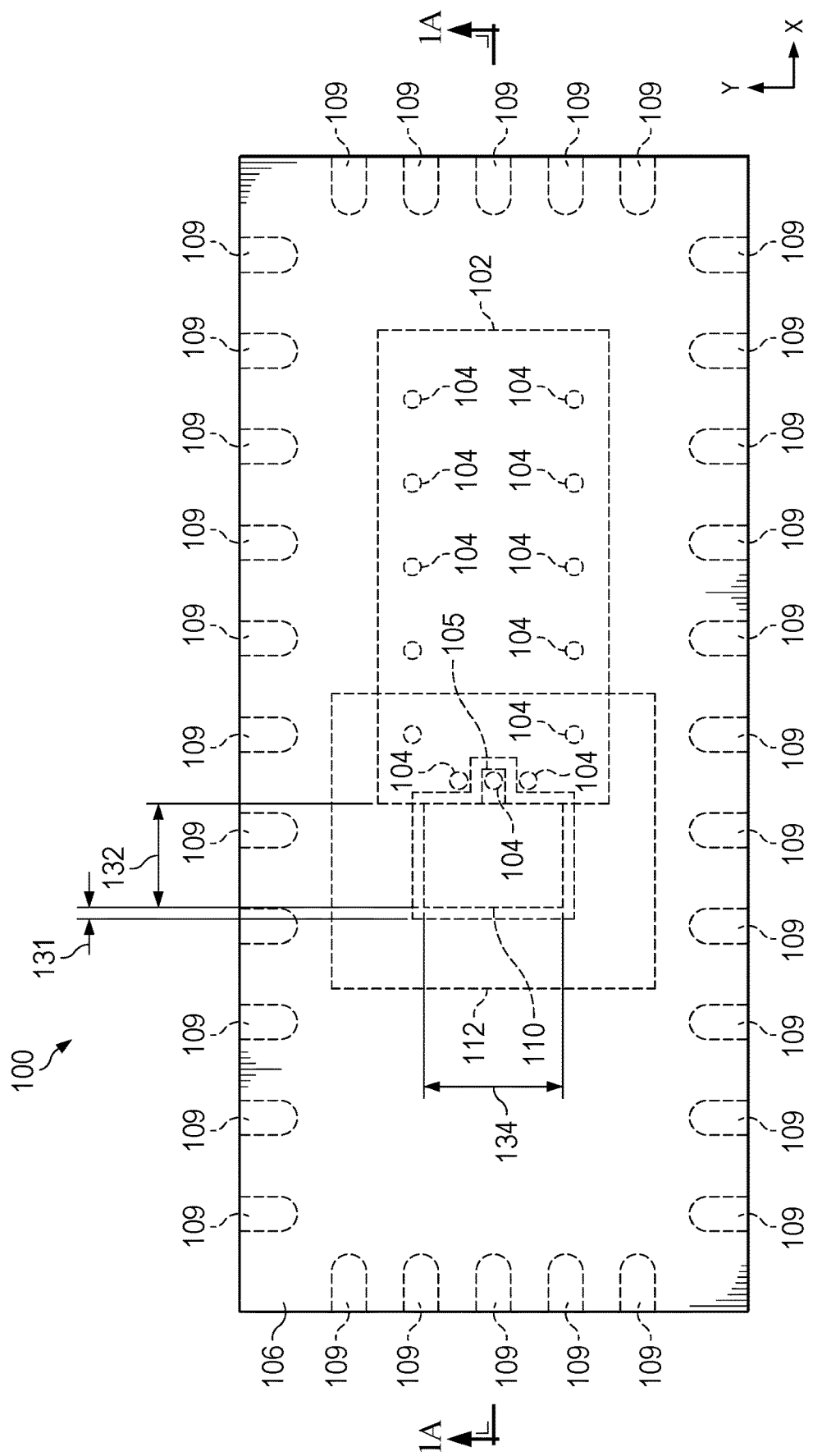
FIG. 1 is a top plan view of an electronic device with a no-lead package, a flip-chip mounted semiconductor die, and a multilevel package substrate with integrated antenna and an epoxy molding compound encapsulation extending above the antenna.

In the drawings, like reference numerals refer to like elements throughout, and the various features are not necessarily drawn to scale. Also, the term "couple" or "couples" includes indirect or direct electrical or mechanical connection or combinations thereof. For example, if a first device couples to or is coupled with a second device, that connection may be through a direct electrical connection, or through an indirect electrical connection via one or more intervening devices and connections. One or more operational characteristics of various circuits, systems and/or components are hereinafter described in the context of functions which in some cases result from configuration and/or interconnection of various structures when circuitry is powered and operating. The example structures include layers or materials described as over or on another layer or material, which can be a layer or material directly on and contacting the other layer or material where other materials, such as impurities or artifacts or remnant materials from fabrication processing may be present between the layer or material and the other layer or material.

Unless otherwise stated, "about," "approximately," or "substantially" preceding a value means+/−10 percent of the stated value. One or more structures, features, aspects, components, etc., may be referred to herein as first, second, third, etc., such as first and second terminals, first, second, and third, wells, etc., for ease of description in connection with a particular drawing, where such are not to be construed as limiting with respect to the claims. Various disclosed structures and methods of the present disclosure may be beneficially applied to manufacturing an electronic device such as an integrated circuit. While such examples may be expected to provide various improvements, no particular result is a requirement of the present disclosure unless explicitly recited in a particular claim.

Figure 1A:
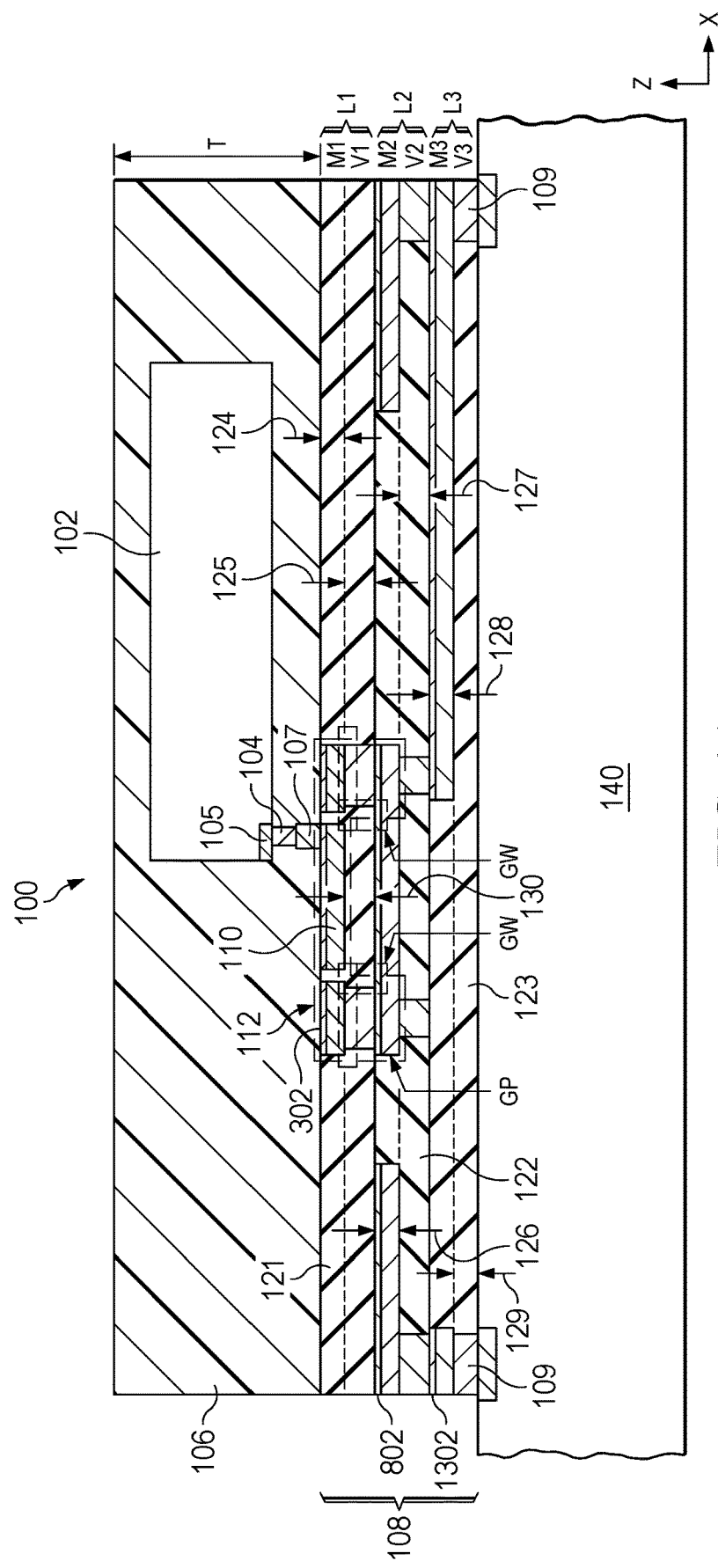
FIG. 1A is a sectional side elevation view of the electronic device taken along line 1A-1A FIG. 1.
Figure 1B:
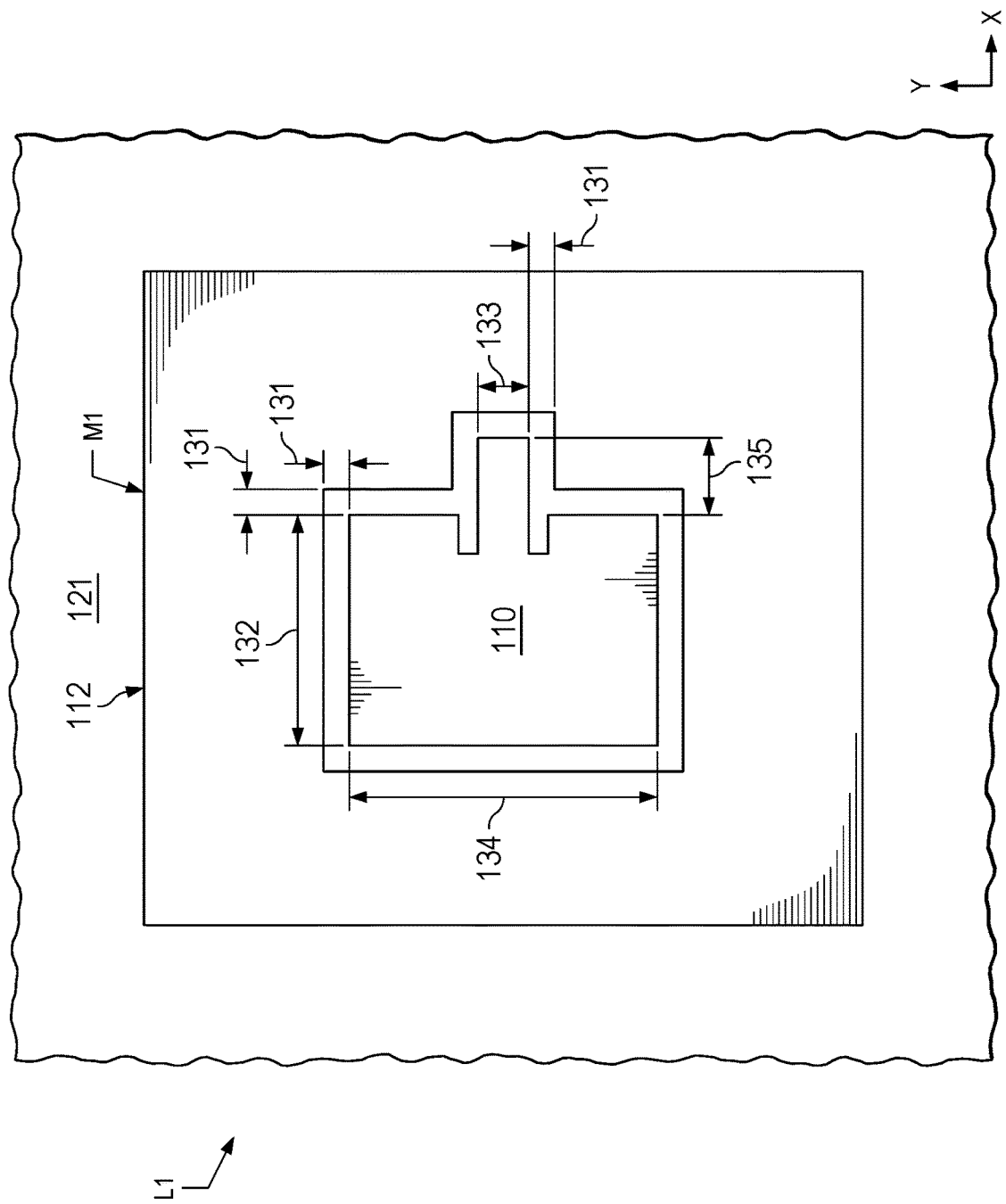
FIG. 1B is a partial sectional top view of a first metal trace layer in the multilevel package substrate of the electronic device of FIGS. 1 and 1A.
Figure 1D:
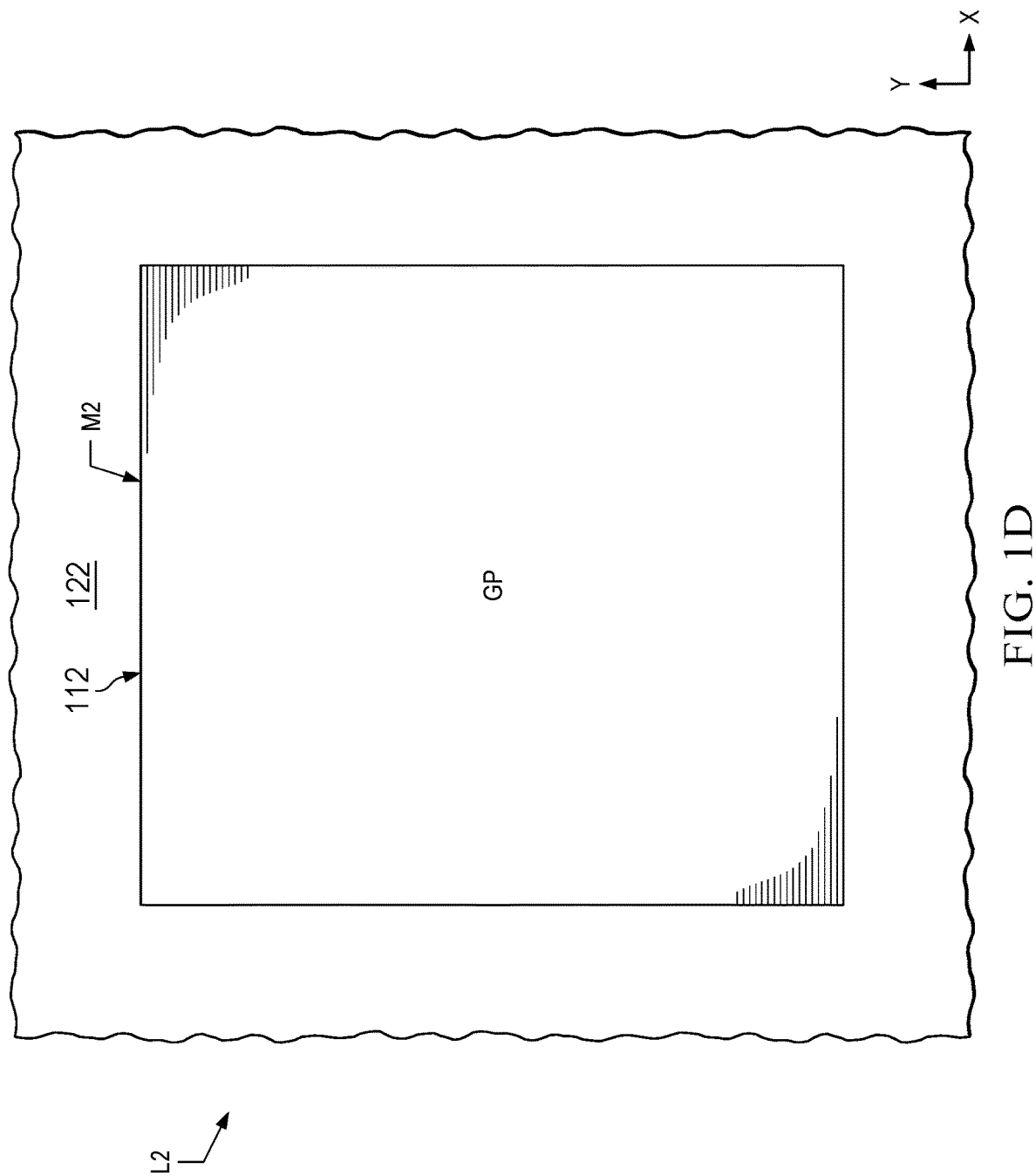
FIG. 1D is a partial top plan view of a second metal trace layer in the multilevel package substrate of the electronic device of FIGS. 1-1C.
Figure 1E:
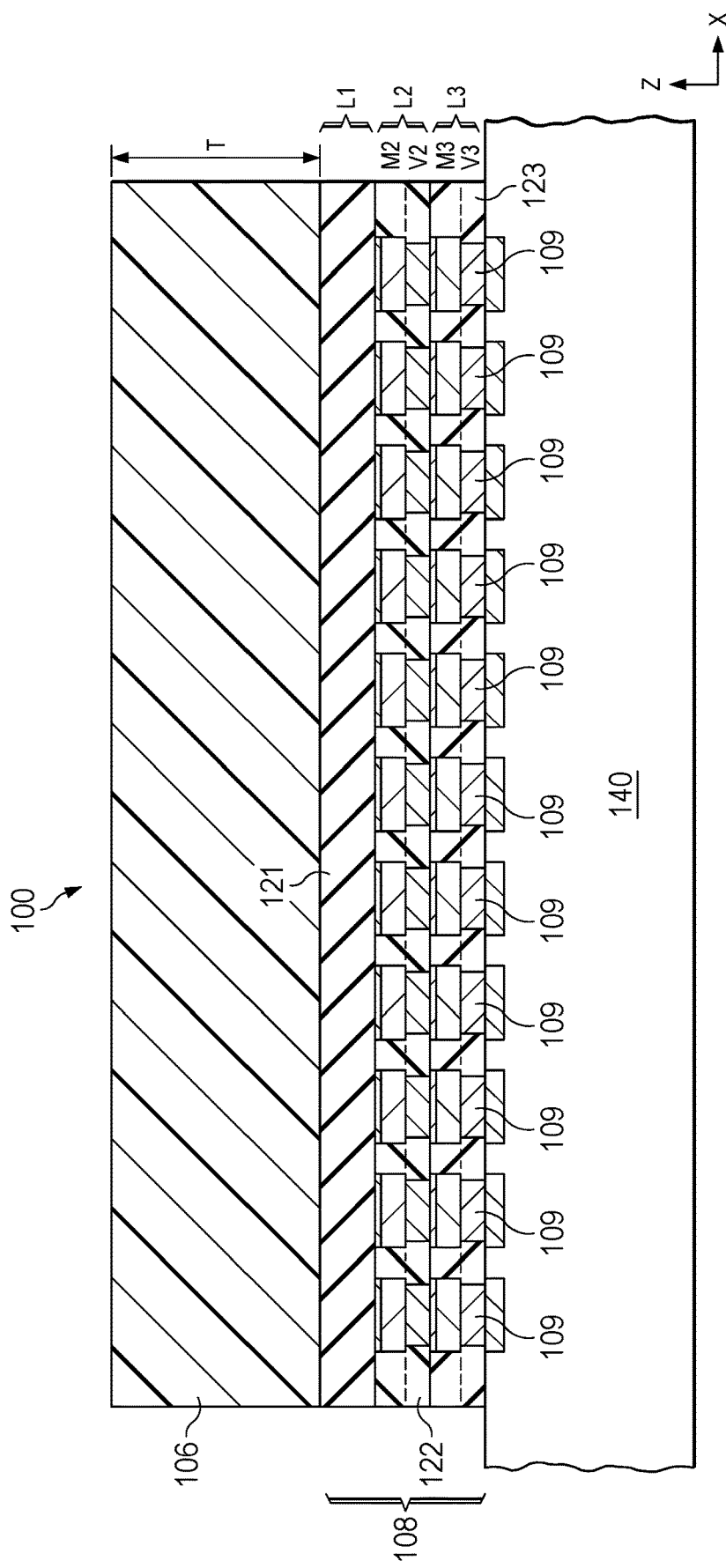
FIG. 1E is a partial side elevation view of a system including the electronic device of FIGS. 1-1D installed on a circuit board.

Referring initially to FIGS. 1-1E, FIGS. 1 and 1A show an example electronic device 100 (e.g., an integrated circuit or a single component electronic device) packaged in a quad flat no-lead (QFN) structure with a flip-chip mounted semiconductor die 102 to provide a flip-chip enhanced QFN (FCeQFN) package with an antenna integrated into a multilevel package substrate and encapsulated by any epoxy-based package mold compound for millimeter wavelength or THz band wireless communications. FIGS. 1B-1D show portions of an example 300-GHz rectangular patch implementation of the antenna structure in first and second levels of the multilevel package substrate, and FIG. 1E shows a partial side view of a system including the electronic device 100 installed on a host system circuit board 140.

As best shown in FIGS. 1 and 1A, the semiconductor die 102 has conductive terminals 104 and conductive pads 105 coupled to respective ones of the conductive terminals 104. In one example, the conductive pads 105 are or include aluminum. In this or another implementation, the conductive terminals 104 are or include copper. A molded package structure 106 encloses the semiconductor die 102 and a portion of a multilevel package substrate 108 (FIG. 1A). The conductive pads 105 are mechanically and electrically connected to conductive features of the multilevel package substrate 108 by solder connections to copper metal studs 107 as shown in FIGS. 1A-1D. Certain ones of the conductive pads 105 and the conductive terminals 104 provide an RF interconnection to an integrated antenna in a ground-signal-ground (GSG) configuration from the semiconductor die 102 by conductive features (e.g., lines or traces) in a multilevel package substrate 108. This allows RF signals to flow from the semiconductor die 102 to the antenna of the multilevel package substrate 108 through the conductive terminals 104, the conductive pads 105 and the studs 107. The electronic device 100 provides an integrated antenna-in-package (AiP) or antenna-on-package (AoP) transmission line in a multilevel package substrate solution for radio frequency (RF) front end modules for wireless applications with integrated antennas.

The multilevel package substrate 108 has a generally rectangular shape with a top or first level L1, a second level L2, and a bottom or third level L3 with conductive leads 109 that allow the electronic device 100 to be soldered to a host printed circuit board or other host system structure (e.g., circuit board 140 as shown in FIGS. 1A and 1E). In another implementation (not shown), the multilevel package substrate 108 includes more than three levels, with conductive leads 109 on the final or lowest level. In one example, the electronic device 100 has leads 109 along four sides (e.g., QFN configuration). In another example electronic device 100 has leads 109 along fewer or greater than four sides. The electronic device 100 in one example provides a compact form factor with single digit millimeter length and width dimensions along respective orthogonal first and second directions X and Y.

The multilevel package substrate 108 includes a conductive metal antenna 110 having a generally rectangular shape that extends in the first level L1 along a top side of the multilevel package substrate 108. As shown in the FIG. 1A, the molded package structure 106 covers a portion of the antenna 110 and the molded package structure 106 has a thickness T along the third direction Z over the antenna 110. In one implementation, the conductive features of the respective levels L1-L3 are or include copper, such as electroplated copper formed and patterned during fabrication of the multilevel package substrate 108.

As shown in FIGS. 1A and 1E, the levels L1-L3 each include a respective dielectric layer and respective patterned conductive features (e.g., patterned copper trace layers and copper via features) that extend in respective first, second, and third planes of the first direction X and the second direction Y (e.g., X-Y planes). The layers L1-L3 are arranged in a stack along a third direction Z that is orthogonal to the first and second directions X and Y, with the second level L2 extending between the respective first and third levels L1 and L3 along the third direction Z.

The first level L1 has a first dielectric layer 121 (FIGS. 1A-IC and 1E) in the first X-Y plane and first patterned conductive features including conductive metal (e.g., copper) features of a first metal trace layer M1 (FIGS. 1A and 1B), and a first metal via layer V1 (FIGS. 1A and 1C). The first level L1 includes an antenna 110 (FIGS. 1-1B) formed as a conductive metal feature of the first metal trace layer M1.

The second level L2 extends between the first and third levels L1 and L3 along the third direction Z and has a second dielectric layer 122 (FIGS. 1A, 1D, and 1E) and second patterned conductive features in the second X-Y plane that include conductive metal features of a second metal trace layer M2 (FIGS. 1A, 1D, and 1E), and a second metal via layer V2 (FIGS. 1A and 1E). The third level L3 has a third dielectric layer 123 (FIGS. 1A and 1E) and third patterned conductive features in the third X-Y plane that include conductive features of a third metal trace layer M3 a third via layer V3.

As shown in FIG. 1A, the first metal trace layer M1 and the features thereof have a thickness 124 along the third direction Z (e.g., 10-30 μm, such as approximately 20 μm, with an etch back dimension of approximately 0-5 μm), the conductive metal features of the first via layer V1 have a thickness 125 along the third direction Z that is greater than the thickness 124 (e.g., approximately 45 μm), and the first via layer thickness 125 corresponds to a spacing distance along the third direction Z between the first and second metal layers M1 and M2. The conductive metal features of the second metal trace layer M2 have a thickness 126 along the third direction Z (e.g., 10-30 μm, such as approximately 20 μm), and the features of the second via layer V2 have a thickness 127 along the third direction Z (e.g., approximately 45 μm). The conductive metal features of the third metal trace layer M3 have a thickness 128 along the third direction Z (e.g., 25-45 μm, such as approximately 35 μm), and the features of the third via layer V3 have a thickness 129 along the third direction Z (e.g., approximately 35 μm), with an etch back dimension of approximately 0-10 μm. The studs 107 of the example multilevel package substrate 108 in one example have a thickness along the third direction Z of 15-45 μm, such as approximately 30 μm.

The multilevel package substrate provides a ground structure 112 that provides a partial cage or shield with an open top in the first and second levels L1 and L2 (FIGS. 1A-1D). As best shown in FIGS. 1A and 1B, the ground structure 112 is spaced apart from and laterally surrounds and underlies the antenna 110. The ground structure 112 includes a ground wall GW laterally spaced from and surrounding the antenna 110 in the first plane. In the illustrated example, the first via layer V1 includes a first portion of the ground wall GW and the first trace layer M1 of the first level L1 includes a second portion of the ground wall GW laterally spaced from and surrounding the antenna 110 in the first plane. In another example (not shown), the ground wall GW is formed entirely in the first via layer V1 of the first level L1. The ground structure 112 also includes a ground plane GP (FIGS. 1A and 1D) of the second trace layer M2 that is connected to the ground plane GP and spaced apart from and below the antenna 110 by a spacing distance 130 (FIG. 1A) along the third direction Z (which corresponds to the first via layer thickness 125).

As best shown in FIGS. 1, 1B and 1C, the antenna 110 includes a generally rectangular main portion and a microstrip feed portion (FIGS. 1 and 1B) with a lateral spacing distance 131 (e.g., approximately 25 μm) between the antenna 110 and the surrounding upper (e.g., second) portion of the ground plane of the ground structure 112. The rectangular patch antenna 110 in one example has a length 132 along the first direction X (e.g., approximately 375 μm). The microstrip feed portion in the illustrated example forms a 50 ohm microstrip feed line with a width 133 along the second direction Y (e.g., approximately 72 μm) in the example top or first metal layer M1 of approximately 20 μm thickness (e.g., thickness 124 along the third direction Z in FIG. 1A). In this example, moreover, the second metal layer M2 ground plane GP has a similar thickness (e.g., approximately 20 μm) and is spaced apart by the spacing distance 130 from the antenna 110 along the third direction Z (e.g., approximately 45 μm below the patch antenna 110). The rectangular patch antenna 110 and the illustrated example has a width 134 along the second direction Y (e.g., approximately 469.2 μm).

The semiconductor die 102 is attached to the first level L1 of the multilevel package substrate 108, for example, using flip chip surface mount technology soldering, and the package structure 106 includes a molding compound that encloses the semiconductor die 102 and extends on the top side of the antenna 110. The lower side of the semiconductor die 102 is spaced along the third direction Z by a spacing distance set by the height of the conductive terminals 104 and the thickness of the studs 107 following flip-chip solder reflow, for example, approximately 20 to 200 μm, where the metal studs 107 on the first trace level M1 provide antenna and ground wall connections from the semiconductor die 102 to the antenna 110.

The antenna 110 extends in the top level L1 of the multilevel package substrate and is encapsulated by the molded package structure 106. In one example, the ground wall GW under the epoxy mold compound encapsulation by the package structure 106 helps to suppress higher order surface wave modes. In addition, the ground structure 112 in this example extends laterally around the periphery of the antenna 110 to help isolate the antenna 110 from surrounding metal layers, including those of a host printed circuit board (e.g., FIG. 1A) to improve directivity and gain in operation of the antenna 110 for wireless communications.

Operation of the antenna 110 for wireless communications can be facilitated by the dimensional features of the multilevel package substrate as well as the material and thickness T of the molded package structure 106. In one example, the semiconductor die 102 is configured to operate the antenna 110 at a wavelength λ and the molding compound thickness T (e.g., FIGS. 1A and 1E) along the third direction Z is 0.125λ or more over the antenna 110. In this or another example, the thickness T of the molding compound is approximately 0.25λ. In a further example, the thickness T of the molding compound is λ/4+/−30%. In another example, the thickness T of the molding compound is approximately λ/4+n λ/2, where n is a positive integer. As further described below in connection with FIG. 24, the radiation efficiency of the antenna 110 exhibits local maxima at approximately λ/4 and at further thickness increments of λ/2 (e.g., λ/4+n λ/2) that can benefit radiation efficiency of the electronic device 100.

The material of the molded package structure 106 (e.g., epoxy-based mold compound) can be selected to enhance the wireless communications performance of the underlying antenna 110. For example, the dielectric loss tangent (e.g., tan δ) of a material affects dissipation of the electrical energy provided by the antenna 110 due to different physical processes such as dielectric relaxation, dielectric resonance and loss from non-linear processes. In one example, the molding of the package structure 106 compound has a loss tangent value that is less than 0.02. In this or another example, the loss tangent value of the molding compound is approximately 0.001 or more and approximately 0.01 or less. In these or the above examples, the local maxima of radiation efficiency at mold compound thickness T of λ/4+n λ/2 may incrementally decrease with increasing values of n, as the effects of dielectric loss tangent value increase with the thickness T of the package structure 106 on the top side of the antenna 110.

FIG. 1E shows a partial side view of an example system with the illustrated electronic device 100 soldered to the printed circuit board 140. In this example, a top copper layer of the printed circuit board 140 has a conductive (e.g., copper) feature that can provide a ground plane that latterly encircles the electronic device 100, which can help to isolate the antenna 110 in order to improve the antenna directivity and the gain in a mm wavelength or THz band.

Referring now to FIGS. 2-22, FIG. 2 shows a method 200 of fabricating an electronic device and FIGS. 3-22 illustrate the electronic device 100 undergoing fabrication processing according to the method 200. At 201 in FIG. 2, wafer processing is performed that fabricates the semiconductor die 102 including the conductive terminals 104 and the conductive pads 105 as described above. The fabricated semiconductor die 102 in one example includes transmitter circuitry (not shown) to provide a radio frequency signal to the antenna 110 with respect to a ground or reference voltage of the ground structure 112 during powered operation of the semiconductor die 102. The wafer level processing at 201 also includes die singulation or separation (not shown) that separates individual semiconductor dies 102 from a processed wafer.

Figure 2:
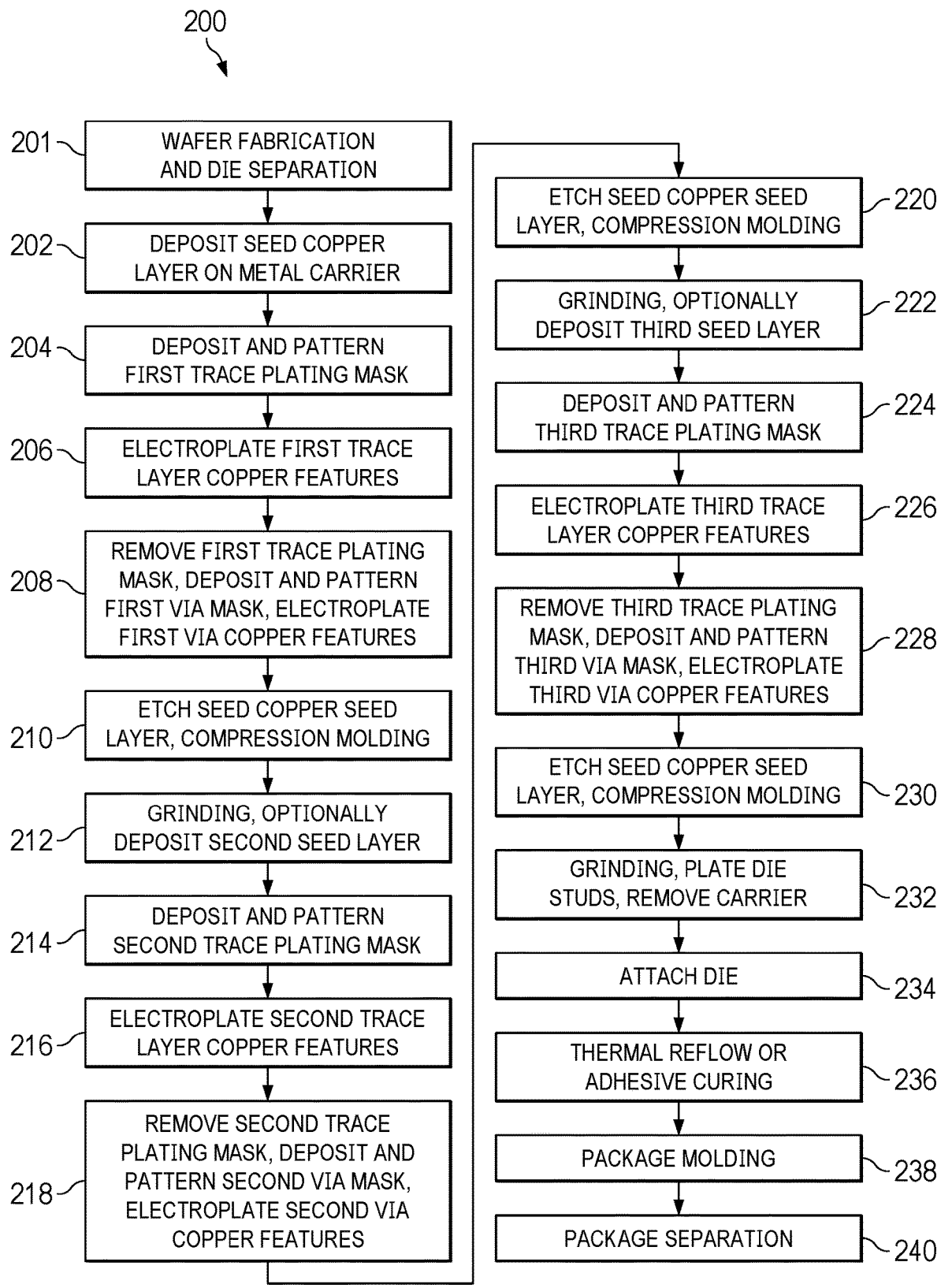
FIG. 2 is a flow diagram of a method of fabricating an electronic device.

The method 200 in FIG. 2 also includes fabricating the multilevel package substrate 108 and the levels L1-L3 thereof at 202-232 with conductive leads 109 in the third level L3, and the patch antenna 110 in the first level L1. The levels L1-L3 in one example are built one at a time starting with deposition of a seed copper layer on a metal carrier at 202. FIG. 3 shows one example, in which a chemical vapor deposition process 300 is performed that deposits a copper seed layer 302 on a metal carrier 301. The process 300 in one example deposits the copper seed layer on both the top and bottom sides of the carrier 301 in the illustrated orientation.

Figure 5:
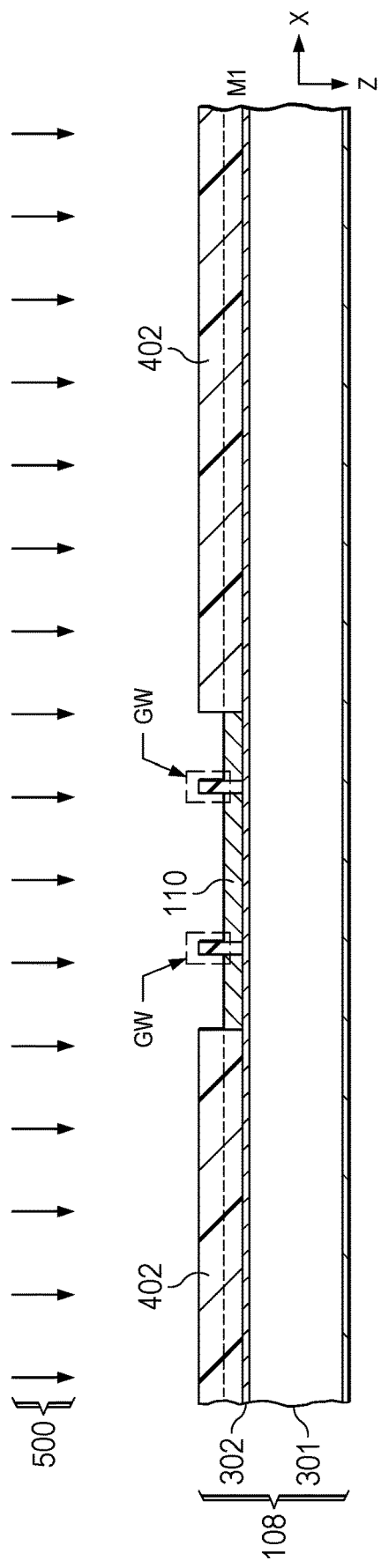
Figure 6:
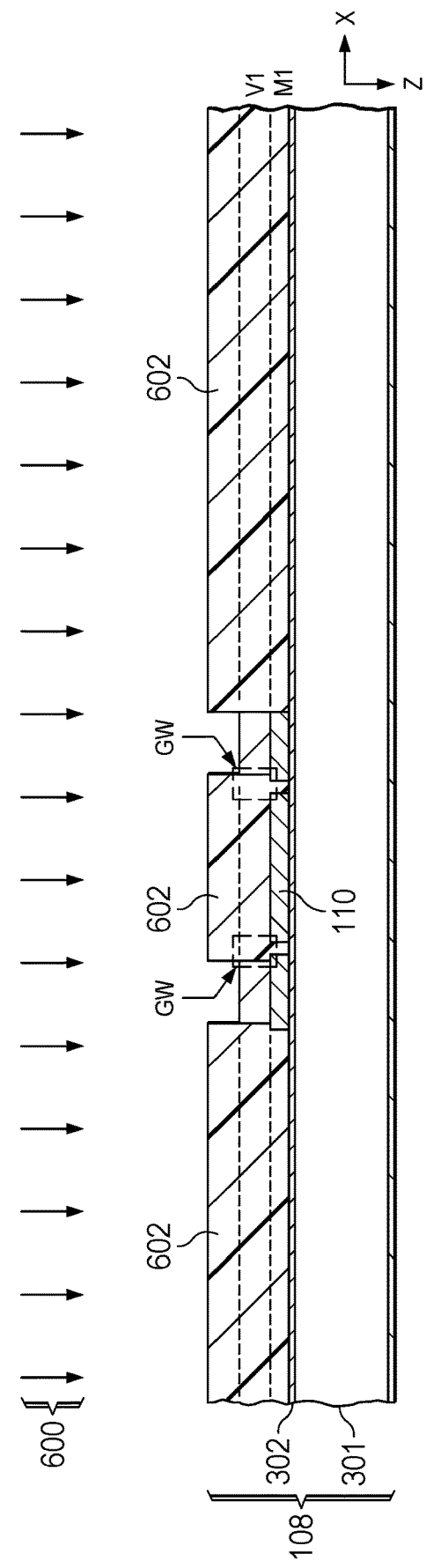

The method 200 continues at 204 with deposition and patterning of a first plating mask. FIG. 4 shows one example, in which a process 400 is performed that deposits and patterns a first plating mask 402 on the copper seed layer 302 on the top side of the carrier 301. The method 200 continues at 206 in FIG. 2 with electroplating copper features of a first trace layer. FIG. 5 shows one example, in which an electroplating process 500 is performed that deposits copper in the exposed areas of the mask 402 to form the copper metal trace features of the first trace layer M1 of the first level L1 on the exposed portions of the copper seed layer 302 on the top side of the carrier 301, including the antenna 110 and the upper second portion of the ground wall GW. At 208, the first plating mask is removed and a first via plating mask is deposited and patterned. FIG. 6 shows one example, in which processing 600 is performed to remove the first plating mask, form and pattern a second plating mask 602, and perform electroplating to form the first via layer V1.

At 210, the method 200 continues with seed layer etching and compression molding for the dielectric of the first level L1. FIG. 7 shows one example, in which a compression molding process 700 is performed that compression molds the first dielectric layer 121 of electrically insulating material between and over the patterned conductive features M1 and V1 of the first level L1. A grinding operation is performed, and a second copper seed layer is deposited at 212. FIG. 8 shows one example, in which a grinding process 800 is performed that grinds and planarizes the top side of the structure. The grinding process 800 removes an upper portion of the compression molded dielectric electrically insulating material to expose upper portions of the conductive via features V1 of the first level L1, and the grinding process 800 can be continued to reduce the thickness of the conductive copper and dielectric features of the first level L1 to a desired final thickness along the third direction Z as shown in FIG. 8. A second copper seed layer 802 is then deposited on the planarized top side of the first level L1 as shown in FIG. 8.

Figure 9:
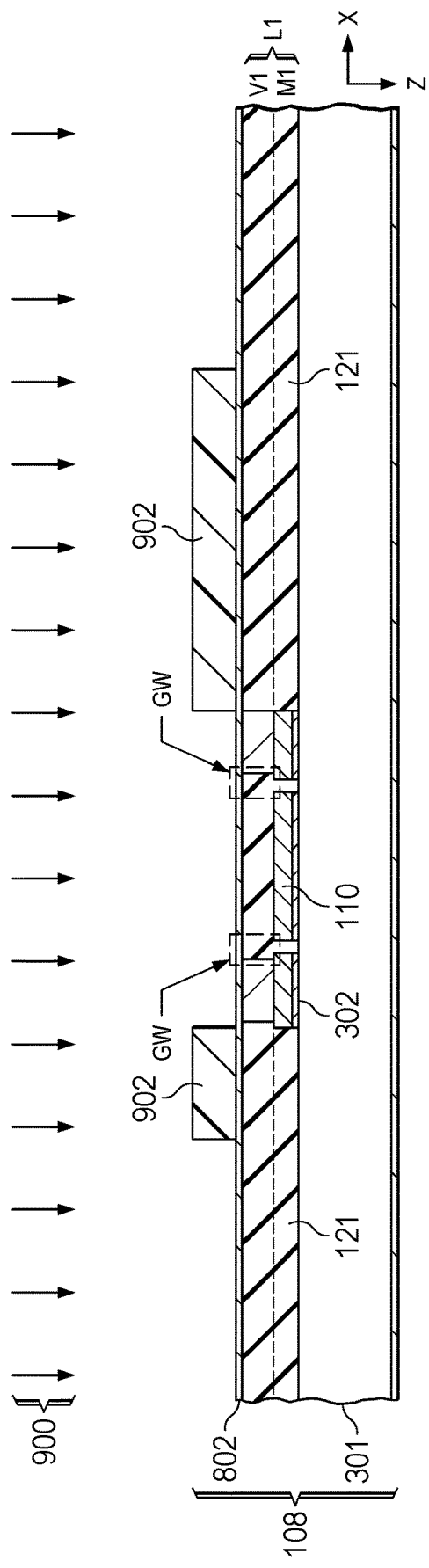
Figure 10:
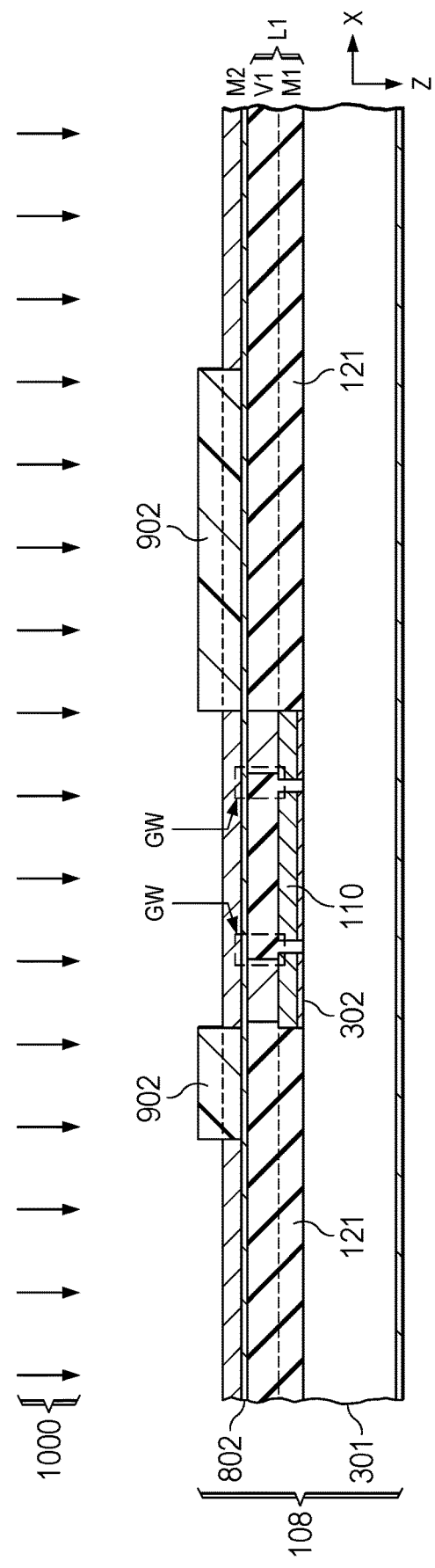
Figure 11:
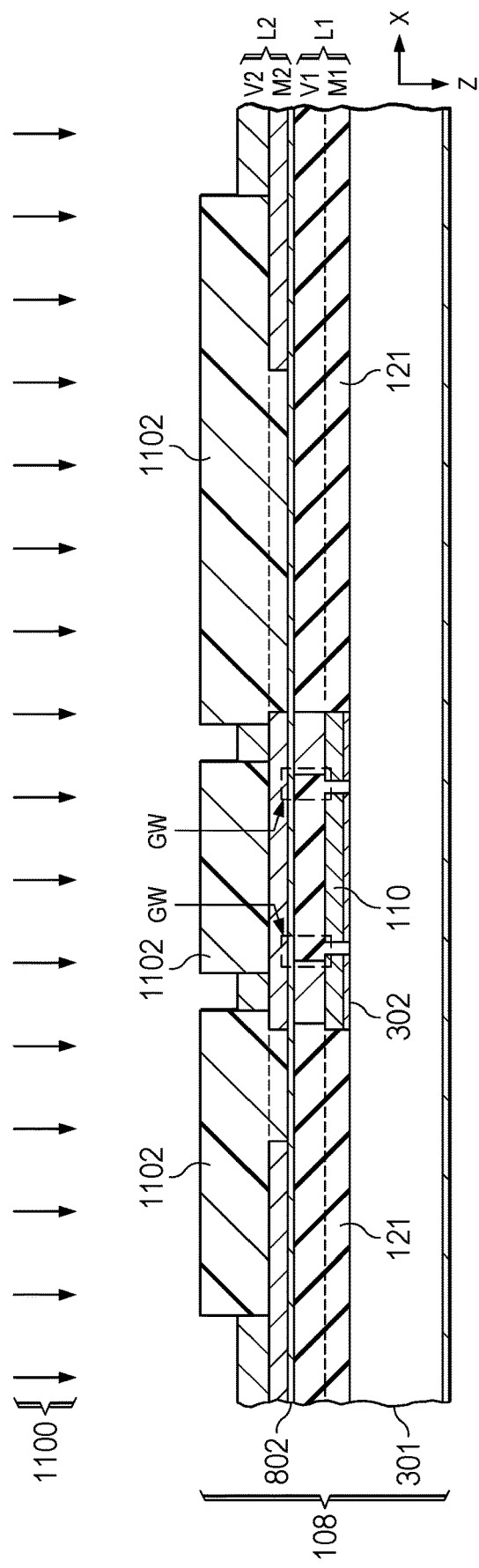

The same or a similar sequence of steps and materials can be used to form the second and subsequent levels L2 (FIGS. 9-13) and L3 (FIGS. 14-18) deposition and patterning of a further plating mask at 214 in FIG. 2. FIG. 9 shows one example, in which a process 900 is performed that deposits and patterns a second plating mask 902 on the top side of the seed layer 802. The method 200 continues at 216 in FIG. 2 with electroplating copper features of the second metal trace layer M2. FIG. 10 shows one example, in which an electroplating process 1000 is performed that deposits copper in the exposed areas of the mask 902 to form copper metal trace layer features M2 on the exposed portions of the first level L1. At 218, the second plating mask is removed, a second via mask is then deposited and patterned, and the second via copper features are electroplated. FIG. 11 shows one example, in which processing 1100 is performed to remove the plating mask 902, form and pattern a plating mask 1102, and electroplate the second via layer features V2 of the second level L2.

Figure 12:
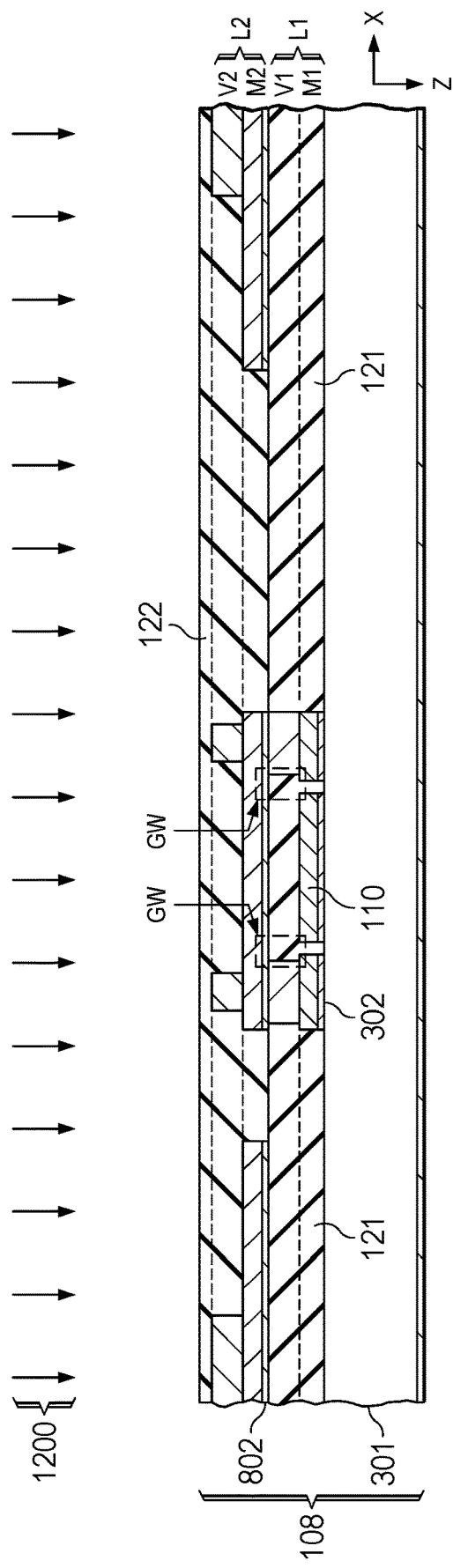
Figure 13:
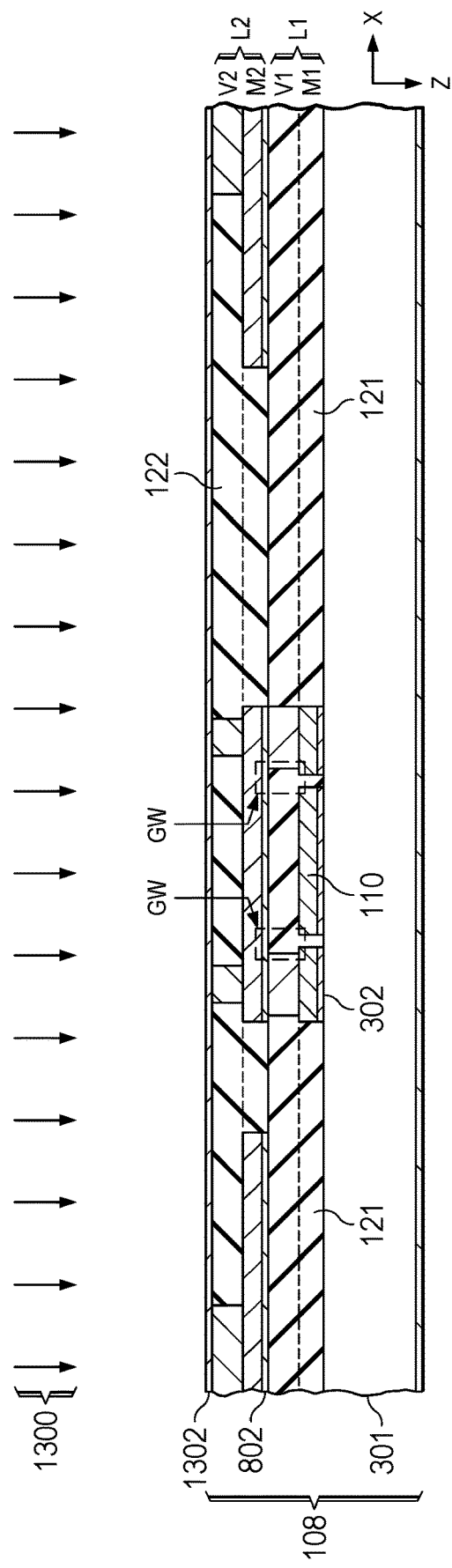

The method 200 continues with etching remnant portions of the second seed layer and compression molding at 220 for the second level. FIG. 12 shows one example, in which a processing 1200 is performed that etches the seed layer and compression molds the second dielectric layer 122 with electrically insulating material between and over the patterned conductive features M2 and V2 of the second level L2. A grinding operation is performed, and a third copper seed layer is deposited at 222. FIG. 13 shows one example, in which a grinding process 1300 is performed that grinds and planarizes the top side of the structure. The grinding process 1300 removes an upper portion of the compression molded dielectric electrically insulating material to expose upper portions of the conductive via features V2 of the second level L2, and the grinding process 1300 can be continued to reduce the thickness of the conductive copper and dielectric features of the second level L2 to a desired final thickness along the third direction Z as shown in FIG. 13. As further shown in FIG. 13, a third copper seed layer 1302 is then deposited on the planarized top side of the second level L2.

Figure 14:
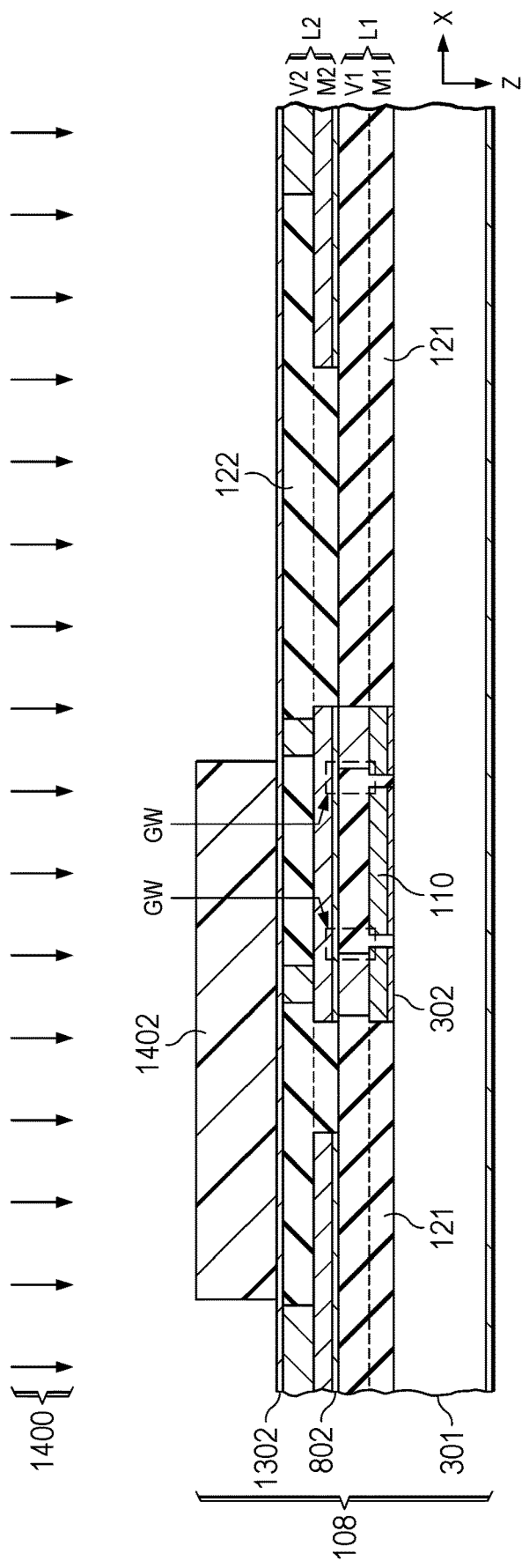
Figure 15:
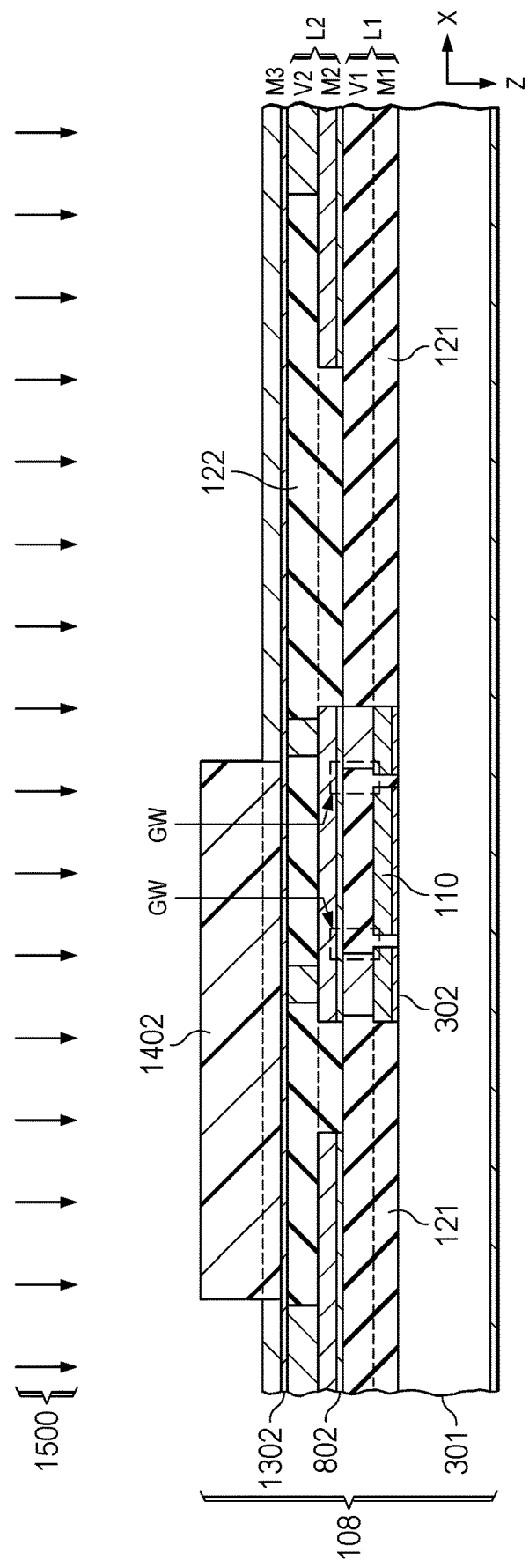
Figure 16:
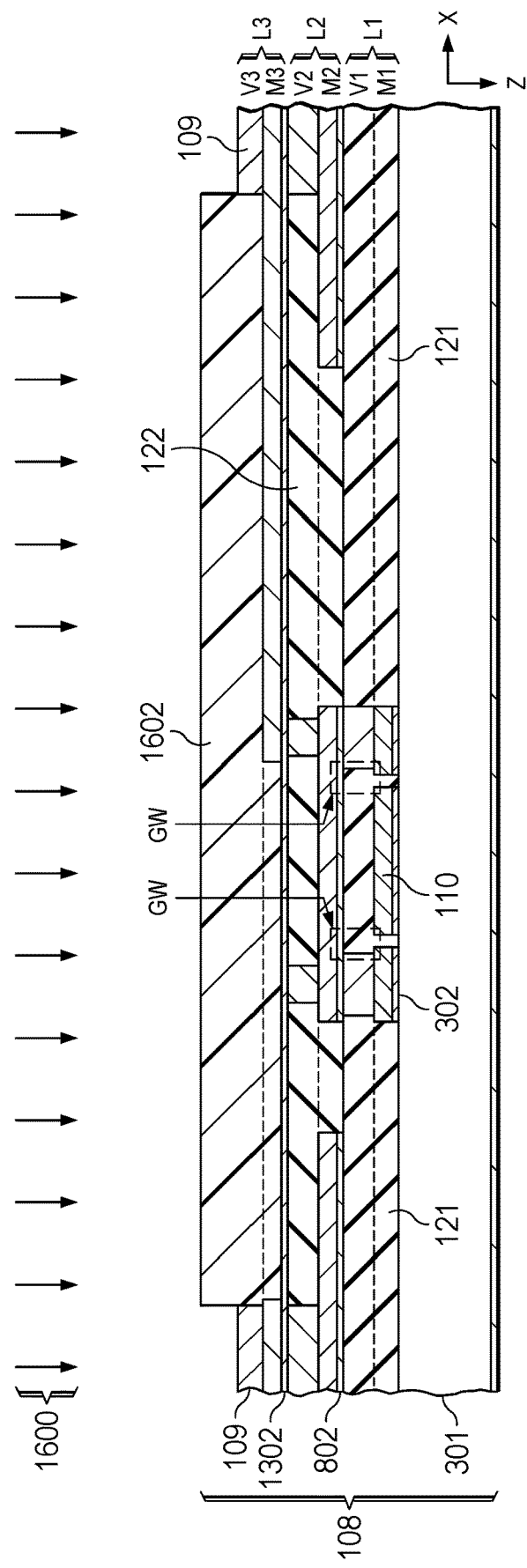

For the illustrated four level example, the third level construction begins at 224 with deposition and patterning of a third plating mask on the third seed layer. FIG. 14 shows one example, in which a process 1400 is performed that deposits and patterns a third plating mask 1402 on the top side of the second level L2. The method 200 continues at 226 in FIG. 2 with electroplating copper features of a third trace layer. FIG. 15 shows one example, in which an electroplating process 1500 is performed that deposits copper in the exposed areas of the mask 1402 to form copper metal trace layer features M3 of the third level L3 on the exposed portions of the second level L2. At 228, the third plating mask is removed, a third via mask is deposited and patterned, and third via features are electroplated. FIG. 16 shows one example, in which processing 1600 is performed to remove the third plating mask, deposit and pattern a third via plating mask 1602, and electroplate the third via layer features V3.

Figure 17:
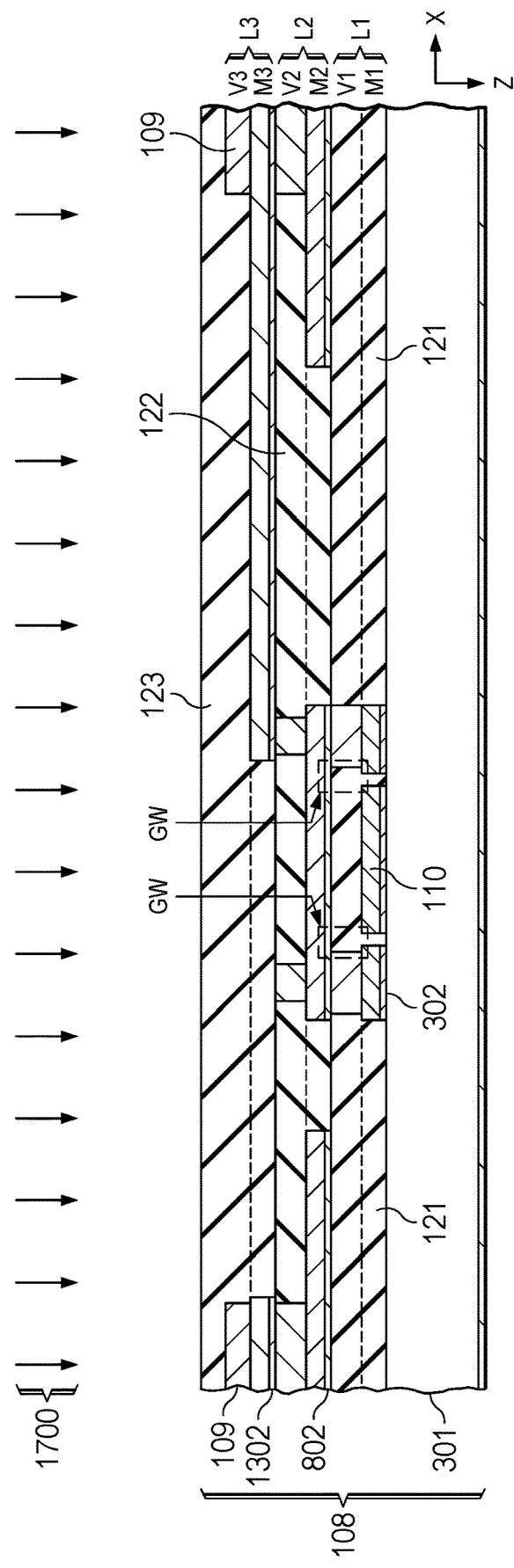
Figure 18:
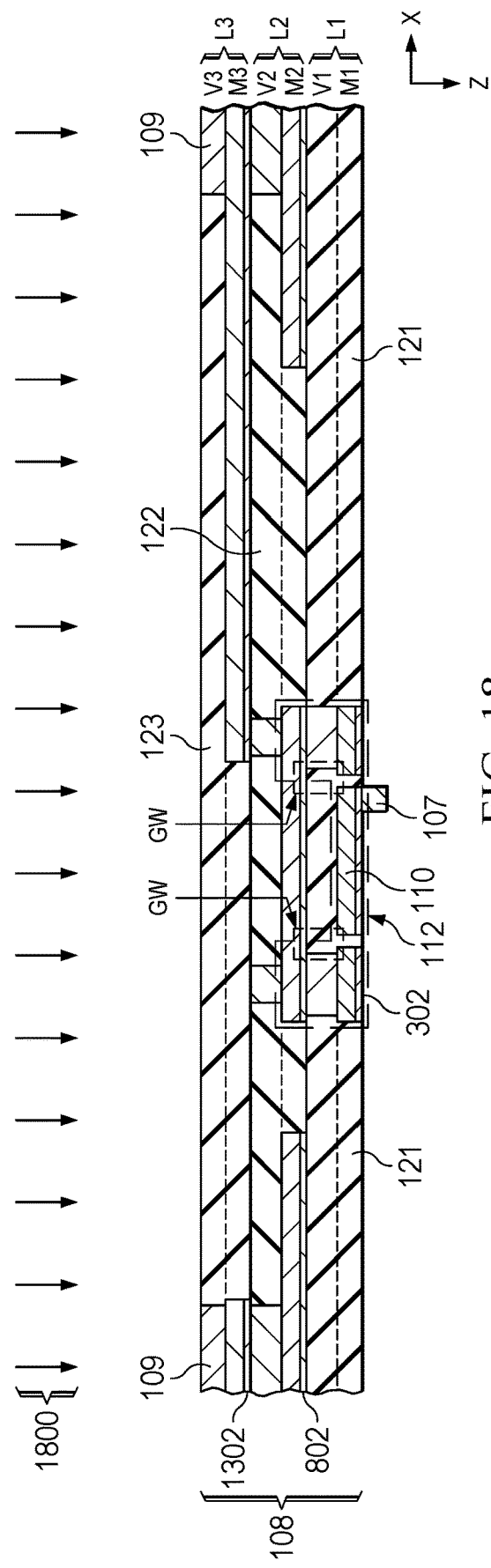

The method 200 continues at 230 with compression molding for the third level L3. FIG. 17 shows one example, in which a compression molding process 1700 is performed that compression molds the third dielectric layer 123 with electrically insulating material between and over the patterned conductive features of the third level L3. A grinding operation is performed at 232. FIG. 18 shows one example, in which a grinding process 1800 is performed that grinds and planarizes the top side of the structure. The grinding process 1800 removes an upper portion of the compression molded dielectric electrically insulating material to expose upper portions of the conductive via features V3 of the third level L3. The grinding process 1800 can be continued to reduce the thickness of the conductive copper and dielectric features of the third level L3 to a desired final thickness along the third direction Z as shown in FIG. 18. Further processing (not shown) can be used in one example to form the conductive studs 107 on select portions of the top side of the first level L1 as shown in FIG. 18.

Figure 19:
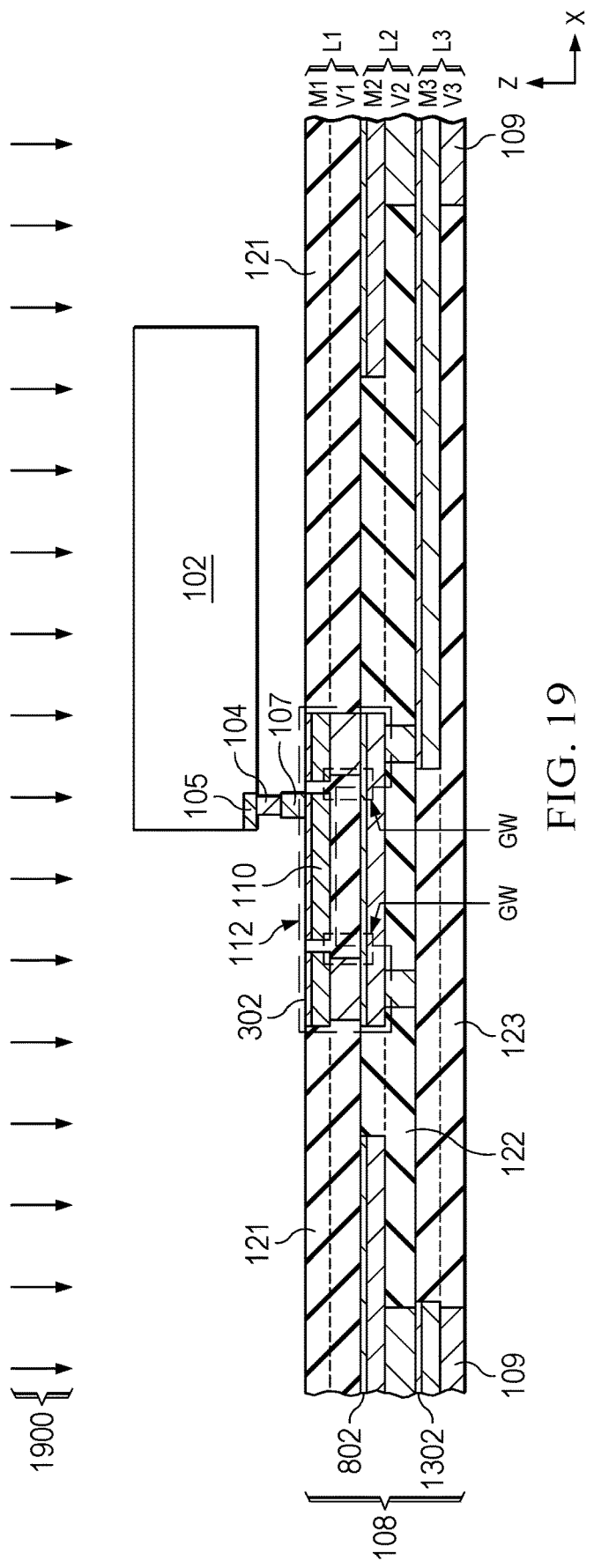
Figure 20:
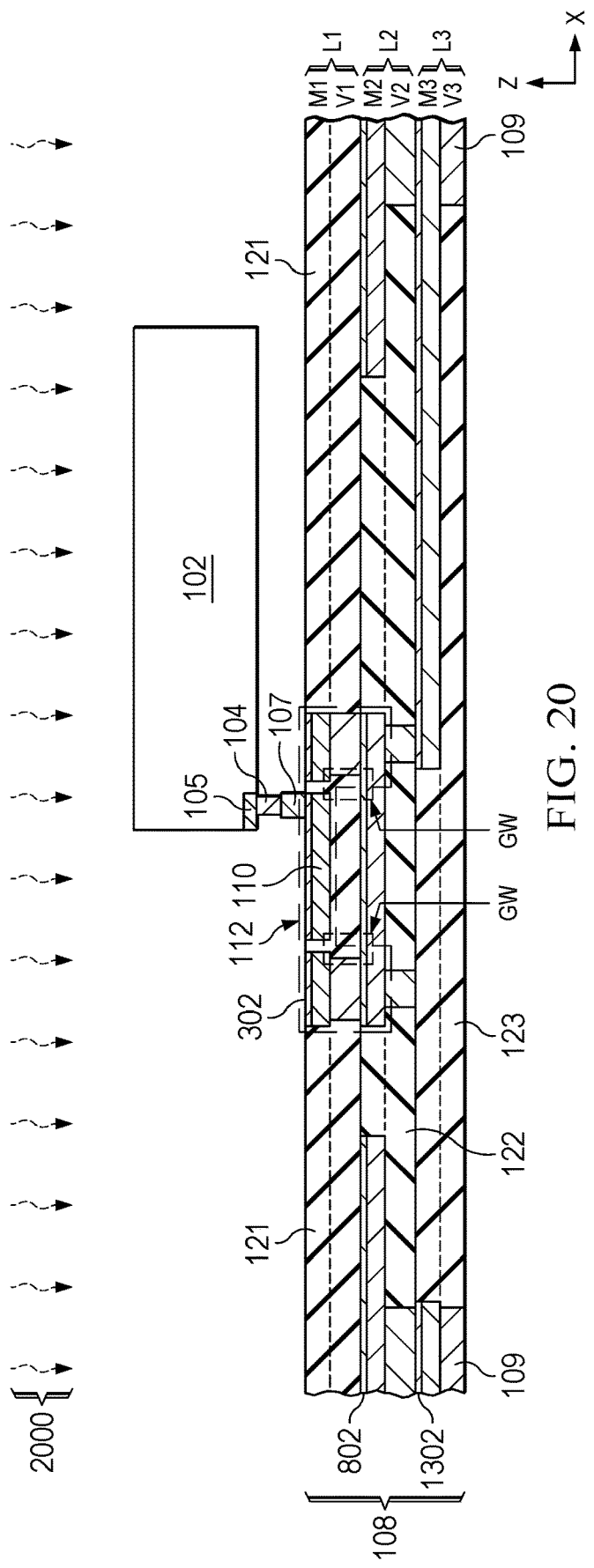

At 234 in FIG. 2, the semiconductor die 102 is attached to the first level L1 of the multilevel packaging substrate 108. FIG. 19 shows one example, in which a flip-chip die attach process 1900 is performed that mounts the semiconductor die 102 on the multilevel packaging substrate 108. The method also includes thermal processing for solder reflow or adhesive curing at 236. FIG. 20 shows one example, in which a thermal process 2000 is performed that reflows the solder to complete the flip-chip mounting of the semiconductor die 102 with the conductive terminals 104 soldered to electrically couple the conductive terminals to respective conductive pads (e.g., studs 107) of the first level L1 of the multilevel package substrate 108.

Figure 21:
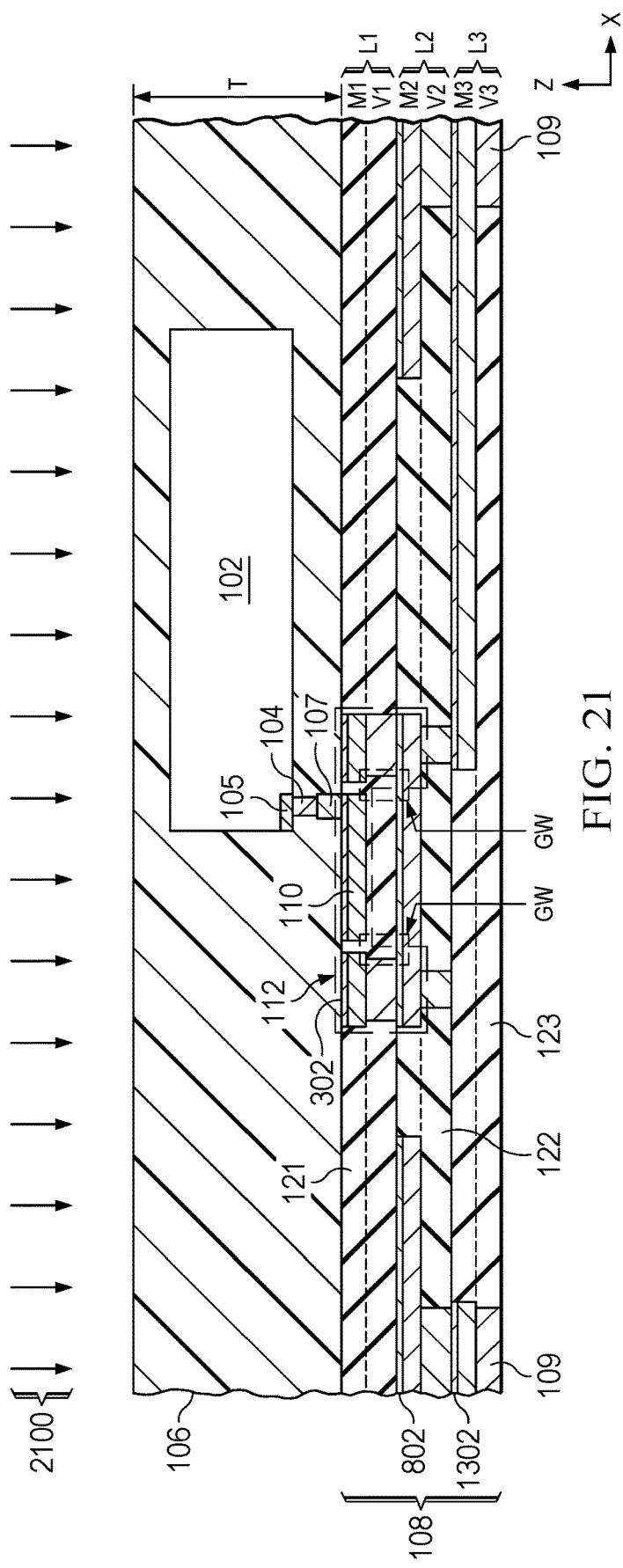

The method 200 includes package molding at 238. FIG. 21 shows one example, in which a molding process 2100 is performed that forms the molded package structure 106 to the desired thickness T as described above. The molding process 2100 uses a designed material with the properties illustrated and described above in connection with the electronic device 100, as well as a mold constructed to provide the desired final thickness T according to the aspects described above.

Figure 22:
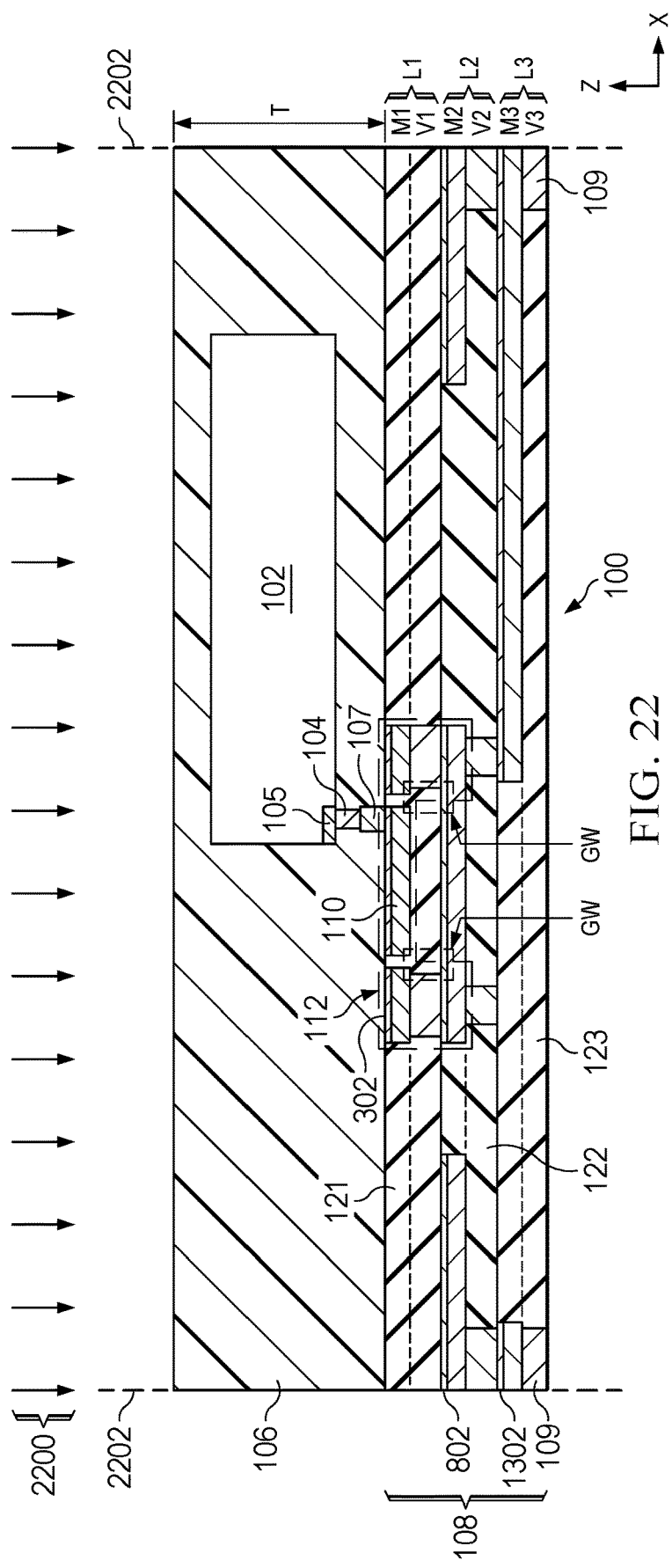

The method 200 also includes package separation at 240. FIG. 22 shows one example, in which a saw cutting or laser cutting process 2200 is performed that separates individual finished packaged electronic devices 100 from a concurrently processed panel or array structure along lines 2202. The separation process 2200 forms sides of the conductive leads 109 that are exposed along respective coplanar sides of the finished packaged electronic device 100.

Figure 23:
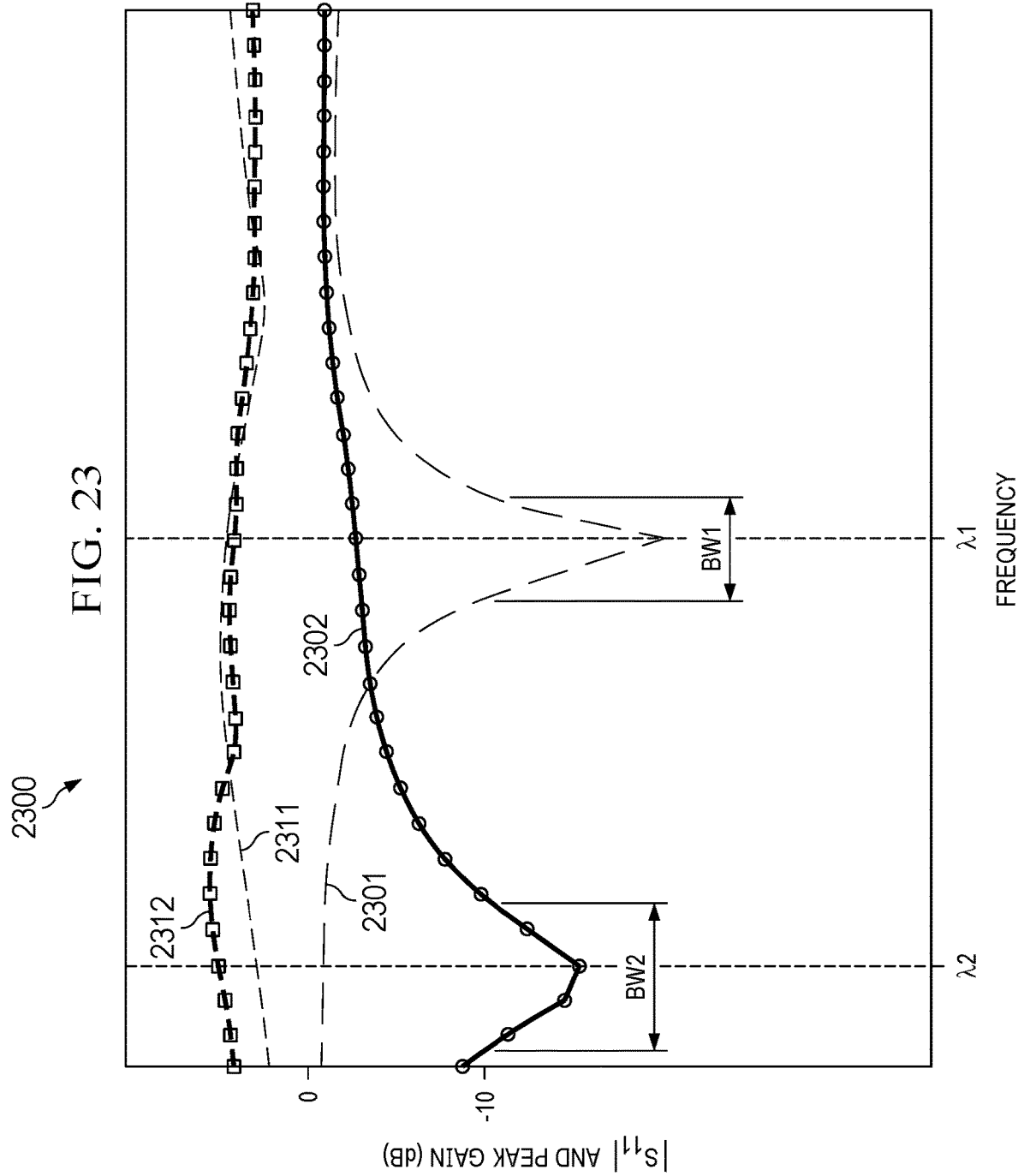
FIG. 23 is a graph including simulated reflection coefficient and peak gain as a function of frequency for the antenna in the electronic device of FIGS. 1-1E.

FIGS. 23 and 24 illustrate simulated antenna performance results for an electronic device 100 as described above. A graph 2300 in FIG. 23 illustrates simulated reflection coefficient S parameter and peak gain performance as a function of frequency for the antenna 110 in an example implementation of the electronic device 100 with and without encapsulation by the epoxy mold compound of the package structure 106 extending over the antenna 110. The graph 2300 includes a curve 2301 of simulated reflection coefficient parameter |S11| for an antenna without epoxy molding compound encapsulation that has a −10 dB bandwidth BW1 at a resonant frequency $\lambda 1$, as well as a curve 2302 that illustrates simulated reflection coefficient parameter |S11| for and antenna with epoxy molding compound encapsulation having a thickness T of approximately 100 μm with a band with BW2 at a corresponding resonant frequency $\lambda 2$ using the epoxy molding compound material with dielectric loss tangent parameters Dk=3.5 and Df=0.013, where the dielectric constant Dk (or relative permittivity, $\varepsilon r$) indicates a material's ability to store electrical energy, dielectric loss represents the energy dissipated as heat in the material when subjected to an electric field, and the loss tangent or tan δ (or dissipation factor, Df) is the ratio of the imaginary part of the dielectric constant to the real part. One suitable over mold epoxy based molding compound used in forming the package structure as an example is HDPE (High Density Polyethylene) with relative permittivity of 2.36 and loss tangent of 0.013 reported at 500 GHz. The use of the epoxy molding compound encapsulation to a thickness T of $\lambda/4$ provides a significantly increased −10 dB bandwidth, where BW2 is greater than BW1.

The graph 2300 also illustrates comparative peak gain performance, including a curve 2311 of peak gain performance of an antenna with no epoxy molding compound encapsulation, and a curve 2312 showing improved peak gain performance of the antenna with epoxy molding compound encapsulation of the T of approximately 100 μm. As shown in the graph 2300, the peak gain performance at the respective resonant frequency is higher for the antenna 110 with epoxy molding compound encapsulation (curve 2312), where the simulated results correspond to an angle ϕ that is not fixed at 0°.

FIG. 24 shows a graph 2400 with curves showing simulated radiation efficiency as a function of epoxy molding compound encapsulation thickness for various encapsulation materials. Efficiency at 300 GHz versus package thickness (μm) for different materials. Effect of packaging encapsulation thickness on radiation efficiency for five EMC materials. The example radiation efficiency curves 2401, 2402, 2403, 2404, and 2405 show improvements with encapsulation thickness T greater than zero, including significant improvement where the thickness T is 0.125$\lambda$ or more over the antenna 110. For example, the curve 2402 corresponds to an epoxy mold compound material of the package structure 106 having Dk=3.5 and Df=0.013. Significant radiation efficiency improvement is seen where the thickness T of the molding compound is approximately 0.25$\lambda$, and in other examples significant efficiency improvement is found where the thickness T is $\lambda/4+/-30\%$, and local maxima points are seen where the thickness T of the molding compound is approximately $\lambda/4+n\ \lambda/2$, where n is a positive integer. The simulated radiation efficiency of the antenna 110 exhibits local maxima at approximately 24 and at further thickness increments of $\lambda/2$ (e.g., $\lambda/4+n\ \lambda/2$) that can benefit radiation efficiency of the electronic device 100, with possible slight reduction of efficiency gain for larger values of n due to the effects of dielectric tangent loss properties of the epoxy molding compound of the package structure 106. The illustrated example provides approximately 18.4% improvement in radiation efficiency when the thickness of encapsulation of the package structure 106 above the patch antenna 110 is $\sim\lambda/4$ in the EMC material corresponding to the curve 2402 (e.g., from 60.8% without epoxy encapsulation to 79.2% efficiency with 140 μm thick over mold epoxy encapsulation). In practice, the actual maxima efficiency peaks may vary slightly from the expected encapsulation thickness optimization points of $\lambda/4$ and $\lambda/4+\lambda/2$, due to interaction between the dielectric material of the first dielectric layer 121 of the multilevel package substrate 102 and the epoxy molding compound of the package structure 106. Similar beneficial results are expected for different designed operating frequencies and associated wavelength 2. In the simulated example, the −10 dB |S11| bandwidth of a 300-GHz patch antenna 110 improves by approximately 2.5 GHZ, from 5.85 GHZ to 8.55 GHz upon encapsulation within a 100 μm ($\sim\lambda/4$) thick epoxy molding compound made of the material corresponding to the curve 2402 in FIG. 24. In addition, the peak gain with this example over mold increases over the entire band of operation.

Modifications are possible in the described examples, and other implementations are possible, within the scope of the claims.

What is claimed is:

1. An electronic device, comprising:
   a multilevel package substrate having a first level, a second level, and a third level, the first, second, and third levels each including a respective dielectric layer and patterned conductive features, the first, second, and third levels extending in respective first, second, and third planes of a first direction and an orthogonal second direction, the second level between the first and third levels along a third direction that is orthogonal to the first and second directions, the first level including a first trace layer with an antenna and a first via layer with a portion of a ground wall laterally spaced outward from and surrounding the antenna, and the second level including a second trace layer having a ground plane connected to the ground wall;

a semiconductor die attached to the first level of the multilevel package substrate; and a package structure including a molding compound enclosing the semiconductor die and extending on a side of the antenna.

2. The electronic device of claim 1, wherein the first trace layer includes a second portion of the ground wall laterally spaced from and surrounding the antenna in the first plane.

3. The electronic device of claim 1, wherein the multilevel package substrate includes metal studs on first trace level for antenna and ground wall connections.

4. The electronic device of claim 1, wherein the multilevel package substrate includes conductive leads in the third level.

5. The electronic device of claim 1, wherein:
the semiconductor die is configured to operate the antenna at a wavelength $\lambda$; and
the molding compound has a thickness along the third direction of $0.125\lambda$ or more over the antenna.

6. The electronic device of claim 5, wherein the thickness of the molding compound is approximately $0.25\lambda$.

7. The electronic device of claim 5, wherein the thickness of the molding compound is approximately $\lambda/4+n\ \lambda/2$, where n is a positive integer.

8. The electronic device of claim 5, wherein the thickness of the molding compound is $\lambda/4+/-30\%$.

9. The electronic device of claim 1, wherein the molding compound has a loss tangent value less than 0.02.

10. The electronic device of claim 9, wherein the loss tangent value of the molding compound is approximately 0.001 or more and approximately 0.01 or less.

11. A system, comprising:
a circuit board; and
an electronic device, comprising:
a multilevel package substrate having a first level, a second level, and a third level, the first, second, and third levels each including a respective dielectric layer and respective patterned conductive features, the first, second, and third levels extending in respective first, second, and third planes of a first direction and an orthogonal second direction, the second level between the first and third levels along a third direction that is orthogonal to the first and second directions, the first level including a first trace layer with an antenna and a first via layer with a portion of a ground wall laterally spaced outward from and surrounding the antenna, the second level including a second trace layer having a ground plane connected to the ground wall, and the multilevel package substrate having conductive leads coupled to the circuit board;

a semiconductor die attached to the first level of the multilevel package substrate; and a package structure including a molding compound enclosing the semiconductor die and extending on a side of the antenna.

12. The system of claim 11, wherein the first trace layer includes a second portion of the ground wall laterally spaced from and surrounding the antenna in the first plane.

13. The system of claim 11, wherein:
the semiconductor die is configured to operate the antenna at a wavelength $\lambda$; and
the molding compound has a thickness along the third direction of $0.125\lambda$ or more over the antenna.

14. The system of claim 11, wherein the molding compound has a loss tangent value less than 0.02.

15. A method of fabricating an electronic device, the method comprising:
fabricating a multilevel package substrate, including forming a first level, a second level, and a third level, the first, second, and third levels each including a respective dielectric layer and respective patterned conductive features, the second level between the first and third levels, the first level including a first trace layer with an antenna and a first via layer with a portion of a ground wall laterally spaced outward from and surrounding the antenna, and the second level including a second trace layer having a ground plane connected to the ground wall;

flip-chip attaching a semiconductor die to the first level of the multilevel package substrate; and forming a package structure including a molding compound that encloses the die and extends on a side of the antenna.

16. The method of claim 15, wherein the first trace layer includes a second portion of the ground wall laterally spaced from and surrounding the antenna.

17. The method of claim 15, wherein:
the semiconductor die is configured to operate the antenna at a wavelength $\lambda$; and
the molding compound has a thickness of $0.125\lambda$ or more over the antenna.

18. The method of claim 17, wherein the thickness of the molding compound is approximately $0.25\lambda$.

19. The method of claim 17, wherein the thickness of the molding compound is approximately $\lambda/4+n\ \lambda/2$, where n is a positive integer.

20. The method of claim 15, wherein the molding compound has a loss tangent value less than 0.02.

* * * * *